(12) United States Patent
Lin et al.

(10) Patent No.: US 7,466,076 B2
(45) Date of Patent: Dec. 16, 2008

(54) LIGHT EMITTING DEVICE AND METHOD FOR FABRICATING THE SAME

(75) Inventors: Ming-Te Lin, Hsinchu Hsien (TW);
Ming-Yao Lin, Hsinchu Hsien (TW);
Kuang-Yu Tai, Hsinchu Hsien (TW);
Ming-Hung Chen, Hsinchu Hsien (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 11/468,333

(22) Filed: Aug. 30, 2006

(65) Prior Publication Data

US 2007/0222381 A1    Sep. 27, 2007

(30) Foreign Application Priority Data

Mar. 23, 2006   (TW) .............................. 95110019 A

(51) Int. Cl.
*H01J 1/62*    (2006.01)
*H01J 63/04*    (2006.01)

(52) U.S. Cl. ........................... 313/512; 313/11; 313/45; 362/294; 361/704

(58) Field of Classification Search .................. 313/512
See application file for complete search history.

(56) References Cited

U.S. PATENT DOCUMENTS 3,739,241 A * 6/1973 Thillays ...................... 257/100

| | | | |
|---|---|---|---|
| 6,476,549 B2 | 11/2002 | Yu | |
| 6,756,731 B1 * | 6/2004 | Sano | 313/499 |
| 2003/0058650 A1 * | 3/2003 | Shih | 362/294 |
| 2003/0184220 A1 * | 10/2003 | Chin | 313/512 |
| 2004/0004435 A1 * | 1/2004 | Hsu | 313/512 |
| 2004/0095782 A1 * | 5/2004 | Isoda | 362/555 |

* cited by examiner

*Primary Examiner*—Nimeshkumar D. Patel
*Assistant Examiner*—Thomas A Hollweg
(74) *Attorney, Agent, or Firm*—WPAT, P.C.; Anthony King

(57) ABSTRACT

A light emitting device and the method for producing the same are disclosed. The light emitting device has at least a light emitting unit with a first electrode and a second electrode for generating a light source when powered on, a conductive element electrically coupled to the first electrode of the light emitting unit and a substrate having a carrier portion for carrying the light emitting unit and a heat dissipating portion extending from the carrier portion and electrically coupled to the second electrode of the light emitting unit, in which the conductive element is disposed on a side of a planar face of the heat dissipating portion, thereby allowing large contact area to be established between the heat dissipating portion and a sub-heat-dissipating system or air so as to achieve good heat dissipation.

40 Claims, 24 Drawing Sheets

LIGHT EMITTING DEVICE AND METHOD FOR FABRICATING THE SAME

FIELD OF THE INVENTION

The present invention relates to light emitting devices, and more particularly, to a light emitting device having a planar heat dissipating portion and a conductive component, and a method for fabricating the light emitting device, the planar heat dissipating having a large contact area for contacting a sub-heat-dissipating system or air, the conductive element being disposed on a planar face of the planar heat dissipating portion.

BACKGROUND OF THE INVENTION

FIG. 1 (PRIOR ART) is a diagram depicting a packaging technique disclosed in U.S. Pat. No. 6,476,549. As shown in FIG. 1 (PRIOR ART), a packaging method for fabricating a horizontal metal of a light emitting diode is shown. A metal substrate 20 is horizontally disposed. A concave 21 is disposed in a central region of the metal substrate 20 for receiving a chip 3. Two sides of the metal substrate 20 are bent downwards to form two metal pins 200, 201 protruding to a region beneath a packaging gel 4 for heat dissipation. A metal pin 22 is formed by a wire bonding technique and electrically coupled to an electrode on the chip 3. A lens 40 is disposed on the chip 3 for shaping emitted light.

However, a contact area between the metal pins 200 and 201, which are formed by the bending of the two sides of the metal substrate 20, and air is limited in size, making the connection with a sub-heat-dissipating system more difficult. Thus, it is unable to provide good heat dissipation, and may cause malfunction or damage in elements when their temperatures get too high.

Therefore, how to provide a technical resolution to solve the above problem that heat cannot be dissipated is becoming one of the most urgent errands in the art.

SUMMARY OF THE INVENTION

In the light of forgoing drawbacks, an objective of the present invention is to provide a light emitting device and the method for producing the same to provide good heat dissipation and heat conduction.

In accordance with the above and other objectives, the present invention discloses a light emitting device, which comprises a light emitting unit comprising a first electrode and a second electrode for generating a light source when powered on; a conductive element electrically coupled to the first electrode of the light emitting unit for power connection; and a substrate comprising a carrier portion for carrying the light emitting unit and a heat dissipating portion extending from the carrier portion for dissipating heat from a plane and electrically coupled to the second electrode of the light emitting unit for power connection, wherein the conductive element is disposed on the planar side instead of the extending side of the heat dissipating portion, thereby providing good heat dissipation through the large contact area of the heat dissipating portion with a sub-heat-dissipating system or air.

In accordance with the above and other objectives, the present invention discloses a light emitting device, which comprises a light emitting unit comprising a first electrode and a second electrode for generating a light source when powered on; a first conductive element electrically coupled to the first electrode of the light emitting unit for power connection; a second conductive element electrically coupled to the second electrode of the light emitting unit for power connection; and a substrate comprising a carrier portion for carrying the light emitting unit and a heat dissipating portion extending from the carrier portion, wherein the first and second conductive elements are disposed on the same side or different sides of a planar face of the heat dissipating portion, thereby providing good heat dissipation through the large contact area of the heat dissipating portion with a sub-heat-dissipating system or air.

Corresponding to the abovementioned light emitting device, the present invention discloses a method for producing a light emitting device, comprising the following steps of: (1) preparing a first substrate unit with a predefined metal pattern comprising a heat dissipating portion; (2) preparing a second substrate unit with a predefined metal pattern comprising at least one temporary connecting pieces; (3) corresponding joining and fixing the second substrate unit to the first substrate unit; (4) disposing a light emitting unit on the first substrate unit; (5) electrically coupling a first electrode and a second electrode of the light emitting unit to predetermined locations, respectively; (6) encapsulating the light emitting unit and portions of the first substrate unit and the second substrate unit by a transparent body; and (7) cutting off the at least one temporary connecting pieces of the second substrate unit.

Compared to the heat dissipating technique of the prior art, the present invention allows the heat dissipating portion of the substrate to have a larger heat dissipating area with a sub-heat-dissipating system or air by extending in X and Y axes (left, right, top, down) two-dimensional space.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

Figure 1:
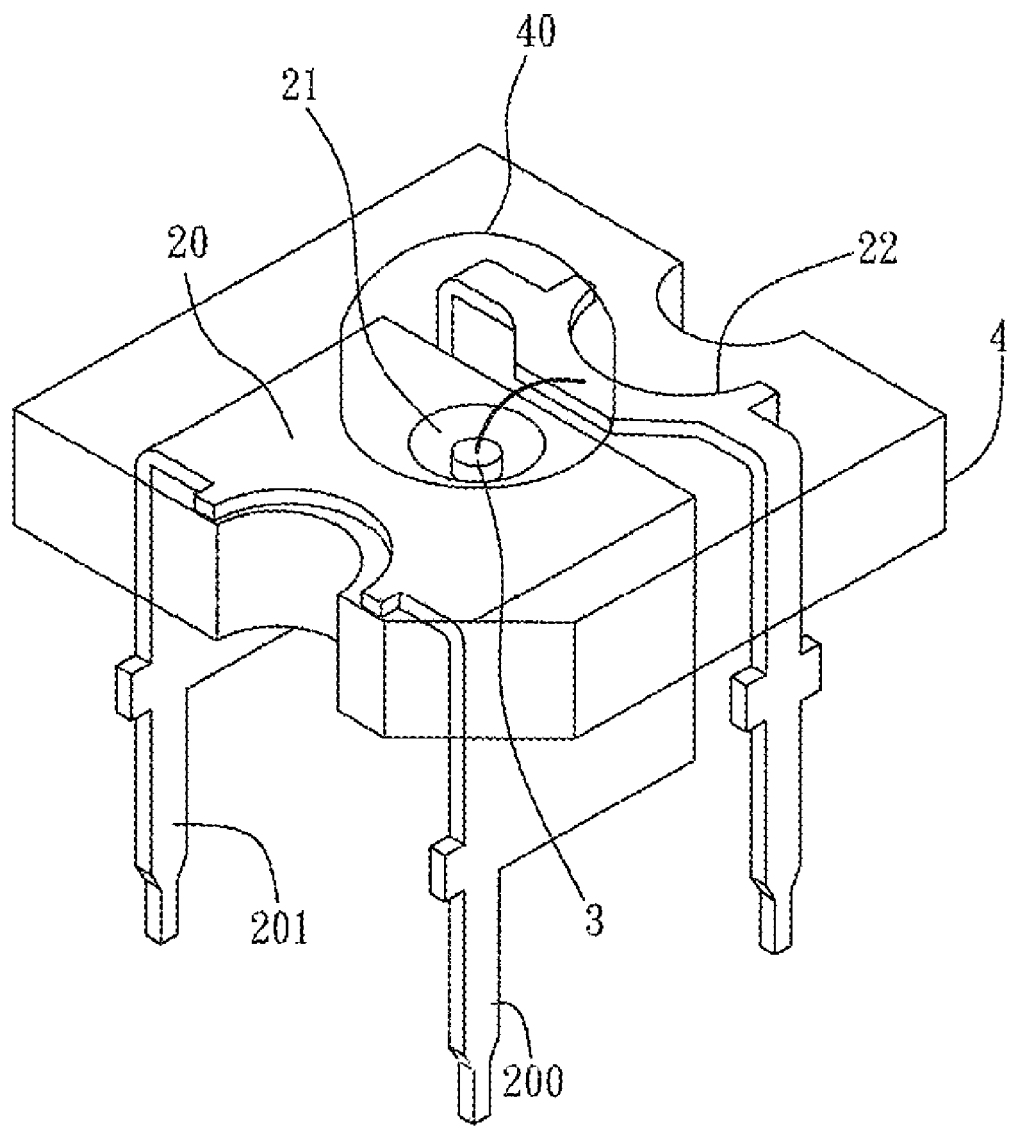
FIG. 1 (PRIOR ART) is a diagram depicting a packaging technique for fabricating a light emitting diode according to the prior art.
Figure 2:
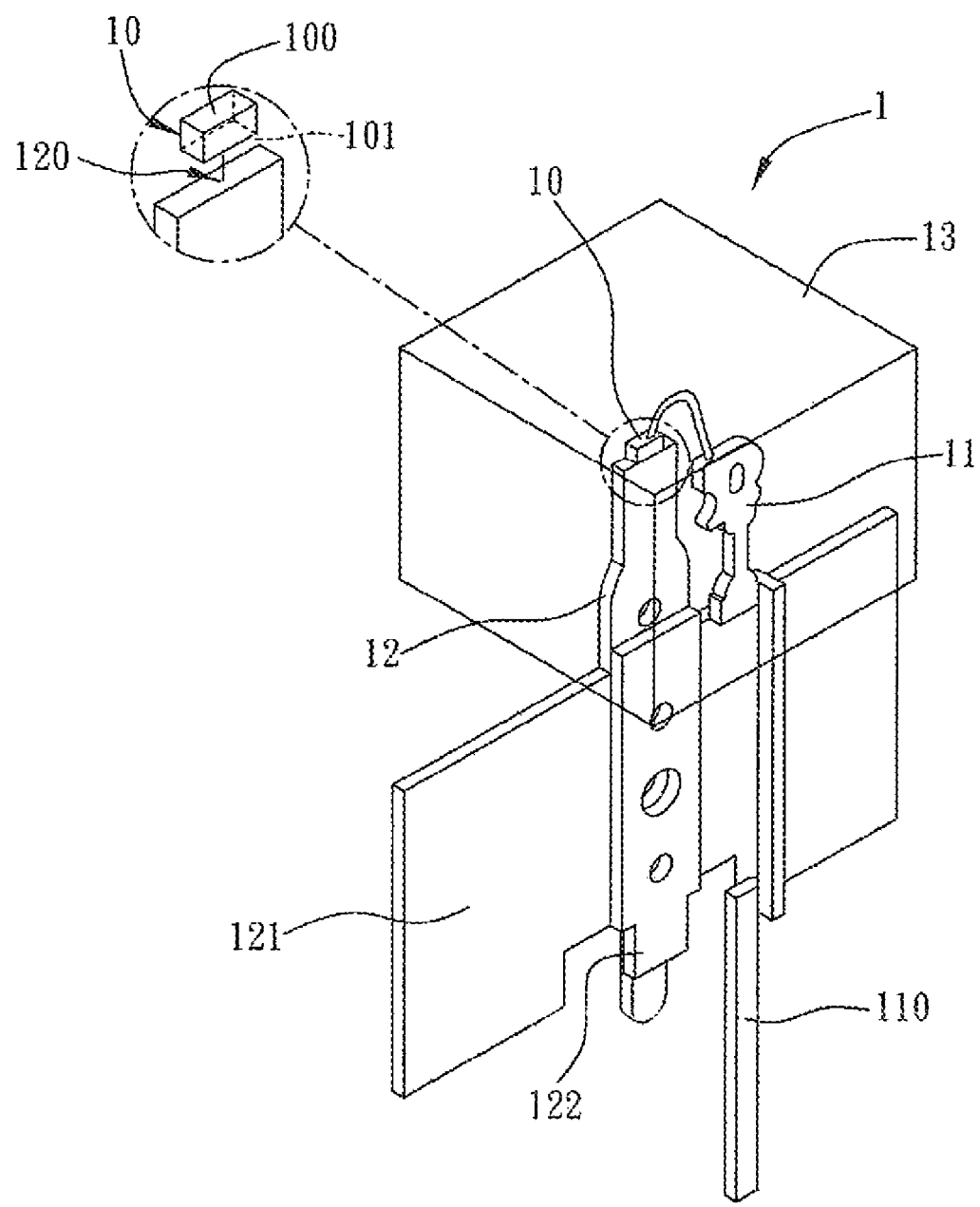
FIG. 2 is a three-dimensional schematic diagram depicting a first embodiment of the light emitting device of the present invention.

Please refer to FIG. 2, which is a three-dimensional schematic diagram depicting a light emitting device 1 of a first embodiment according to the present invention. The light emitting device 1 comprises a light emitting unit 10, a conductive element 11 electrically coupled with the light emitting unit 10, a substrate 12 electrically coupled to the light emitting unit 10, and a transparent body 13 covered on the light emitting unit 10 and part of the conductive element 11 and substrate 12.

The light emitting unit 10 comprises a first electrode 100 and a second electrode 101, both of which emit light when powered on. In the first embodiment, the light emitting unit 10 is a light emitting chip including the first electrode 100 and the second electrode 101, which are disposed on top and bottom surfaces of the light emitting chip respectively. However, the present invention is obviously not limited to this; for example, the light emitting unit 10 can be implemented as a light emitting chip with electrodes on both sides, that is, the first electrode 100 and the second electrode 101 are disposed on the same surface.

The conductive element 11 is electrically coupled to the first electrode 100 of the light emitting unit 10 for power connection. In the first embodiment, the conductive element 11 is a metal pin.

The substrate 12 comprises a carrier portion 120 for carrying the light emitting unit 10, and a heat dissipating portion 121 extending from the carrier portion 120 for dissipating heat. The carrier portion 120 is electrically coupled to the second electrode 101 of the light emitting unit 10 for power connection. The conductive element 11 is disposed on a side of the heat dissipating portion 121 and not on the same horizontal plane as the heat dissipating portion 121, so as to dissipate heat effectively via the large contact area with air or a sub-heat-dissipating system externally connected provided by the heat dissipating portion 121 of the substrate 12. In this embodiment, since the light emitting unit 10 is a light emitting chip having the first electrode 100 and the second electrode 101 disposed on the top and the bottom surface thereof respectively, the bottom surface of the light emitting unit 10 is simply placed on the substrate 12 in a flip-chip manner to achieve electrically coupling between the second electrode 101 of the light emitting unit 10 and the substrate 12. Alternatively, if the light emitting unit 10 is a light emitting chip having electrodes on both sides, the second electrode 101 of the light emitting unit 10 is electrically coupled to the substrate 12 via wire bonding. Furthermore, the carrier portion 120 in this embodiment is provided on the cross section of the substrate 12. As shown in the drawing, the carrier portion 120 is disposed on the cross section of the protruding front end of the substrate 12. The planar heat dissipating portion 121 can have heat dissipating areas extending differently in X and Y axes (left, right, top, down) two-dimensional space depending on heat dissipating requirement.

The transparent body 13 is used for fixing and protecting the light emitting unit 10 on the carrier portion 120 of the substrate 12 and allowing the conductive element 11 and the substrate 12 to form relative fixing position. In this embodiment, the transparent body 13 has a square cross section, but the present invention is not limited to this, instead the shape of the transparent body 13 can be implemented according to actual need. The transparent body 13 is preferably made of packaging gel (e.g. a resin).

As shown, a metal plate 122 of the substrate 12 and a pin 110 of the conductive element 11 can be electrically coupled to an external base material such as a socket or a circuit board. More particularly, the substrate 12 may be electrically coupled to the external base material (not shown) via the metal plate 122 in a planar contact manner. The pin 110 of the conductive element 11 may be electrically coupled to the external base material (not shown) in an insertion or planar contact manner. The physical coupling would depend on actual design needs.

Figure 3:
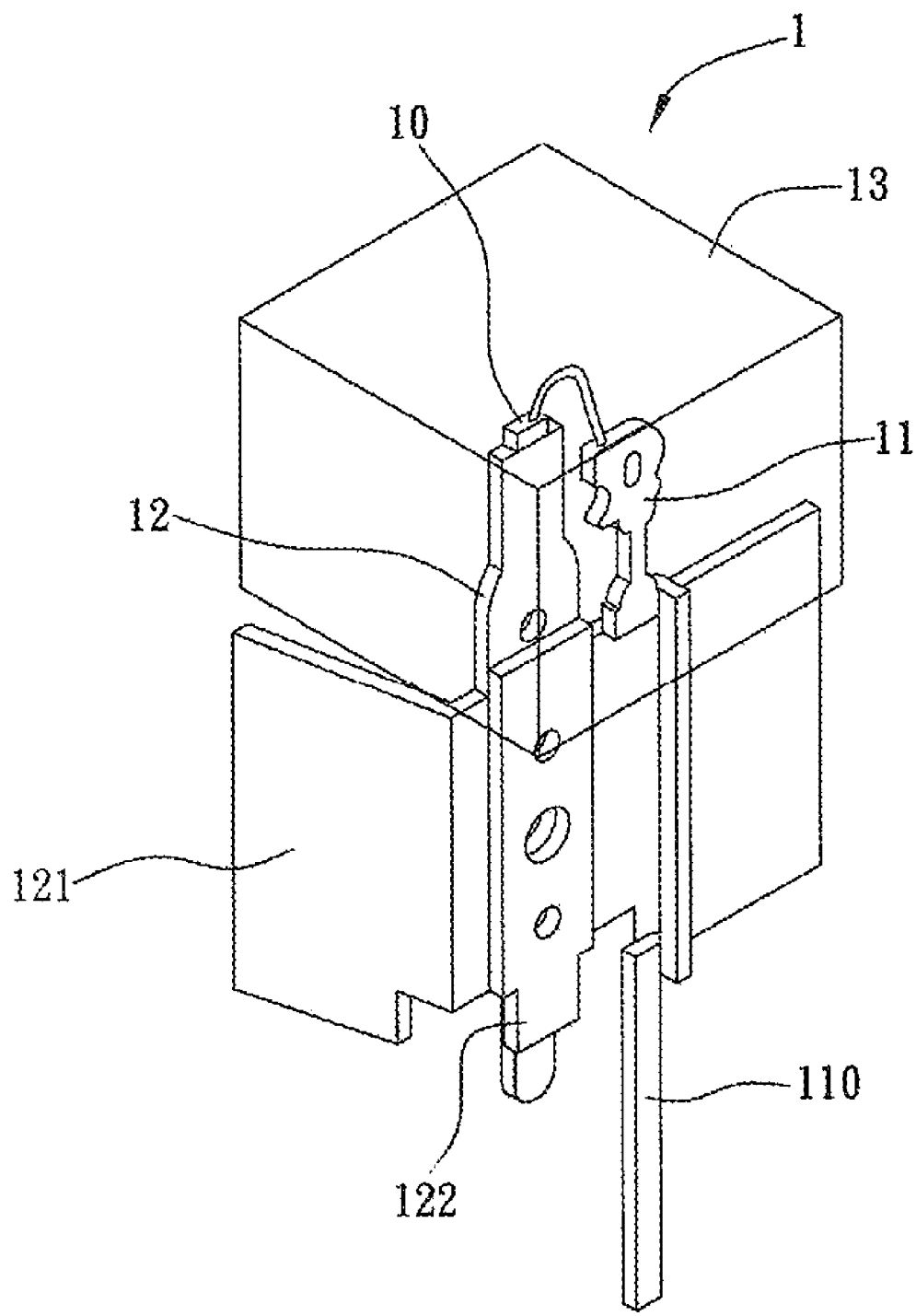
FIG. 3 is a schematic diagram depicting a second embodiment of a heat dissipating portion of a substrate of the light emitting device of the present invention.

FIG. 3 is a schematic diagram depicting another embodiment of the heat dissipating portion 121 of the substrate 12 of the light emitting device of the present invention. As shown, the heat dissipating portion 121 of the substrate 12 may be bent with respective to the optical axis of the light generated from the light emitting unit 10 (the bending angle depends on actual implementation). The purpose of bending the heat dissipating portion 121 is that when the light emitting unit 1 of the present invention is electrically coupled to an external material such as a socket or a circuit board, the planar area on the surface of the external base material occupied by the light emitting device 1 is reduced. In other words, the space on the surface of the external base material can be more efficiently utilized. Additionally, the overall robustness of the light emitting device 1 is enhanced as a result of the bent heat dissipating portion 121.

Figure 4:
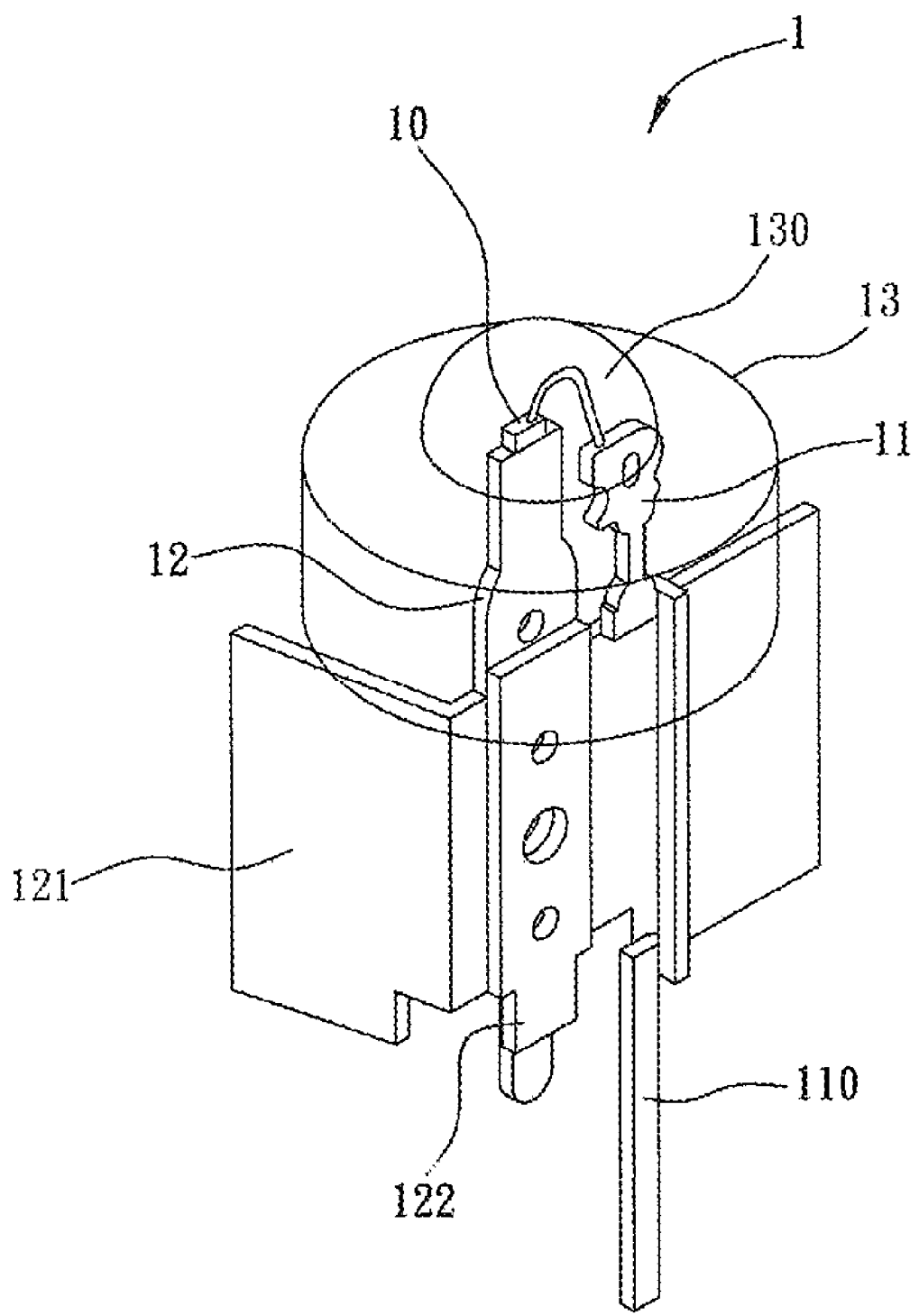
FIG. 4 is a schematic diagram depicting the second embodiment of a transparent body of the light emitting device of the present invention.

Referring to FIG. 4, the transparent body 13 of the light emitting device 1 of the present invention may also be designed in a bulb-like shape. As shown, the transparent body 13 comprises a lens 130 for shaping the light emitted by the light source generated by the light emitting unit 10.

Figure 5:
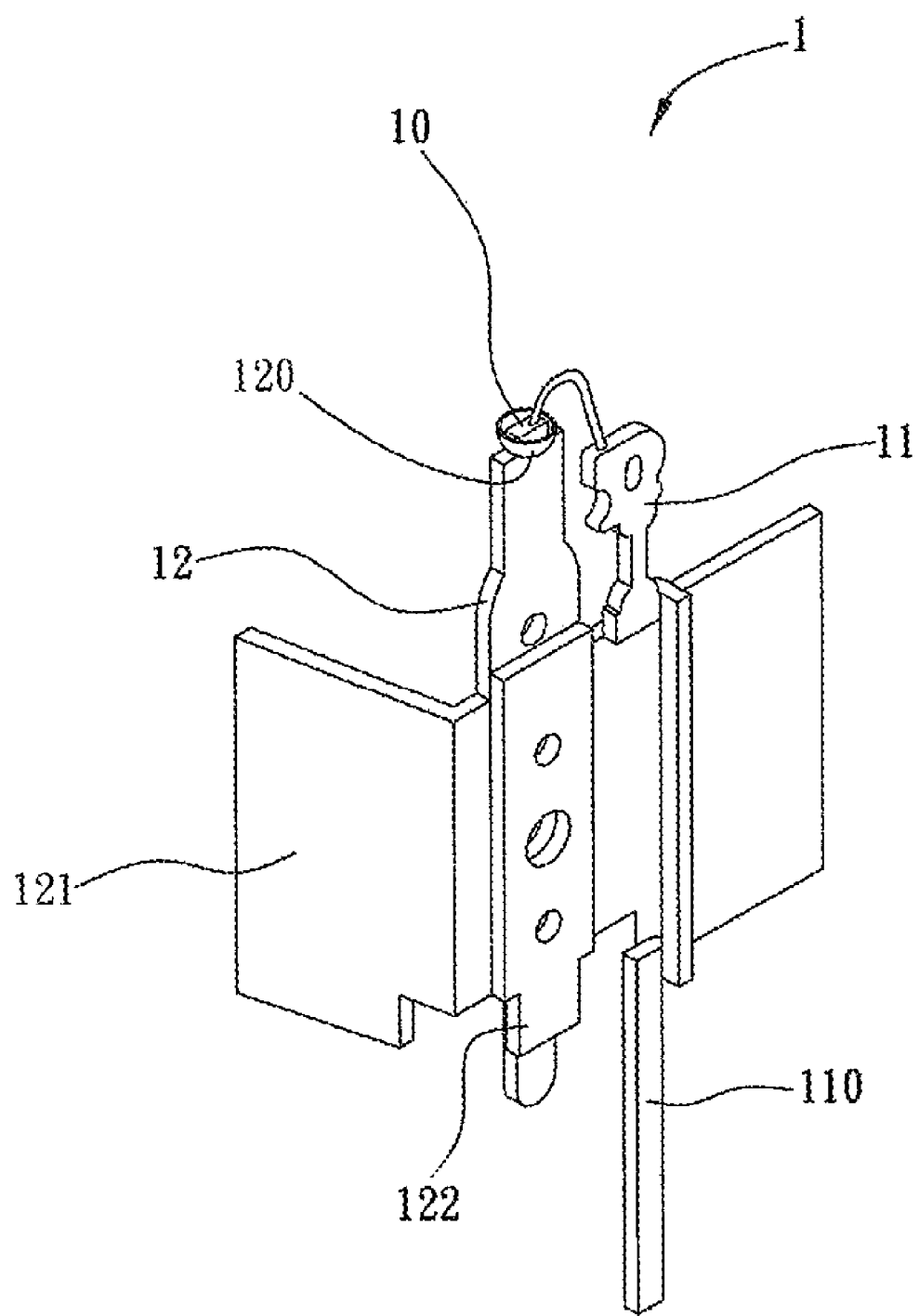
FIG. 5 is a schematic diagram depicting the second embodiment of a carrier portion of the substrate of the light emitting device of the present invention.

Referring to FIG. 5, the carrier portion 120 of the substrate 12 of the light emitting device 1 of the present invention may be disposed on the concave on the top end of the substrate 12 to converge the light radiated from the light emitting device 10. As shown, the concave on the top end of the substrate 12 has a bowl shape, but the present invention is not limited to this.

Figure 6:
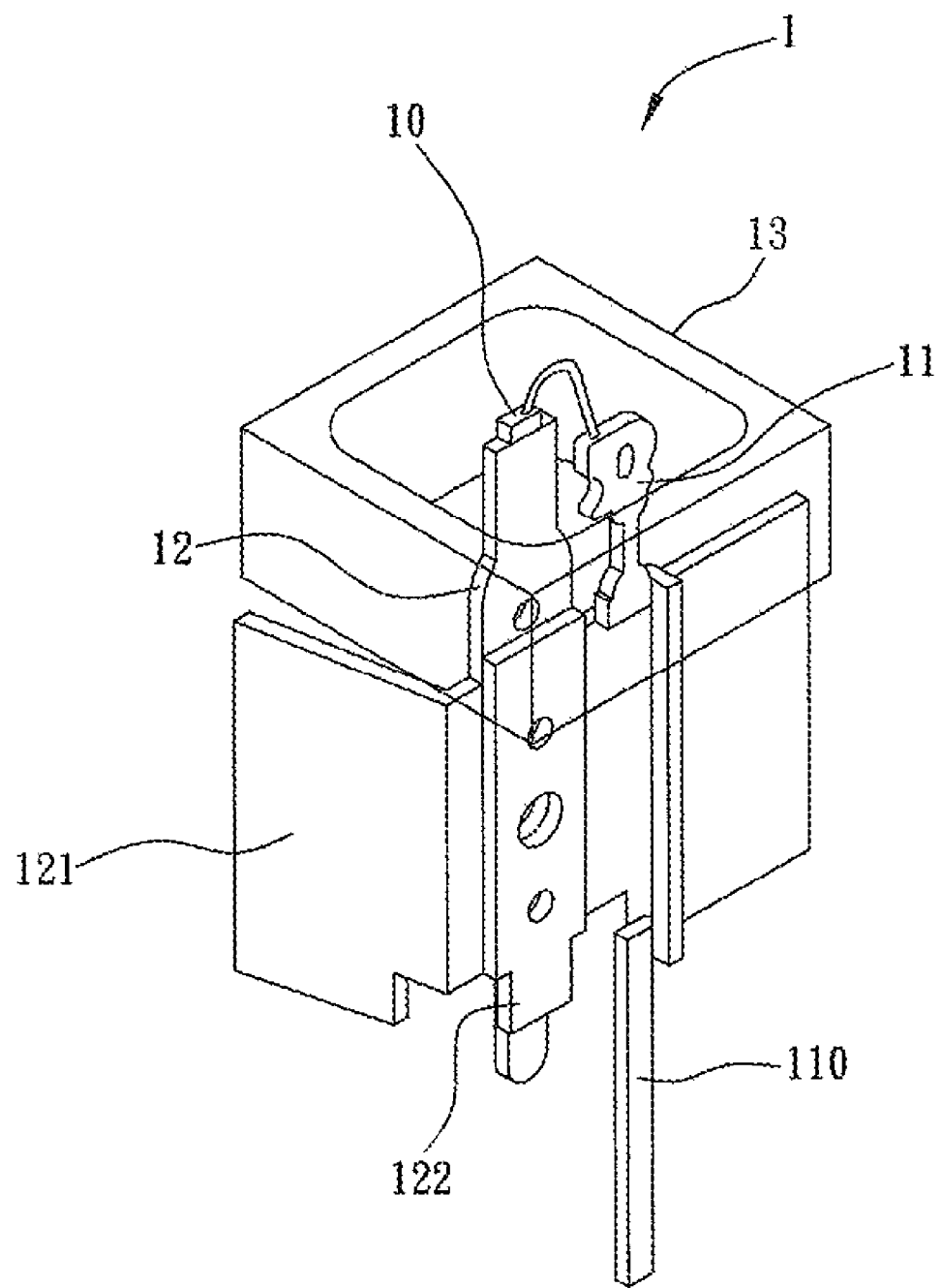
FIG. 6 is a schematic diagram depicting a third embodiment of the transparent body of the light emitting device of the present invention.

Referring to FIG. 6, the transparent body 13 of the light emitting device 1 of the present invention partly fixes the top end of the substrate 12 and the conductive element 11 to enhance product reliability, as well as allows the conductive element 11 and the substrate 12 to form relative fixing positions.

Figure 7:
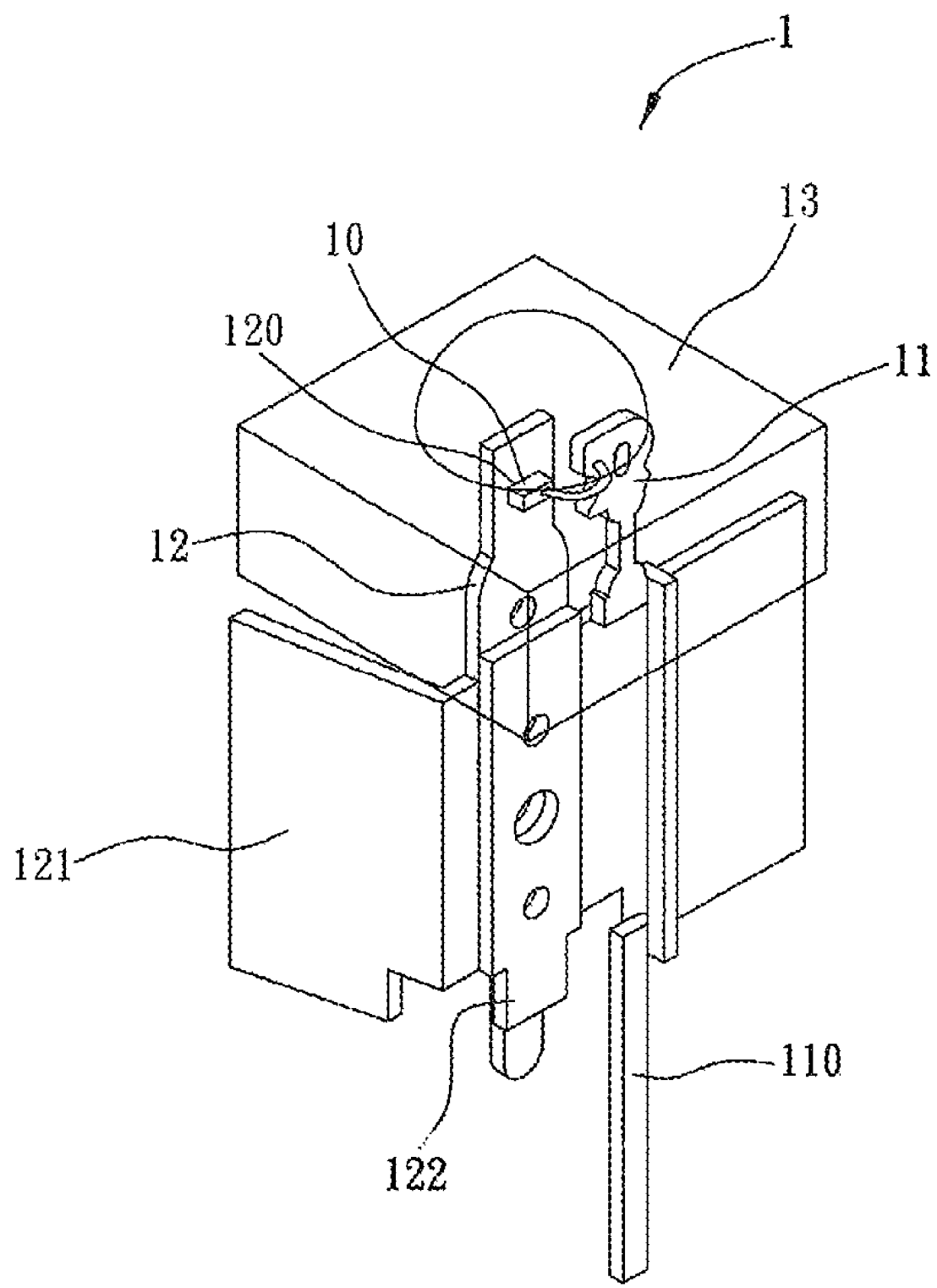
FIG. 7 is a schematic diagram depicting the third embodiment of a carrier portion of a substrate of the light emitting device of the present invention.
Figure 8:
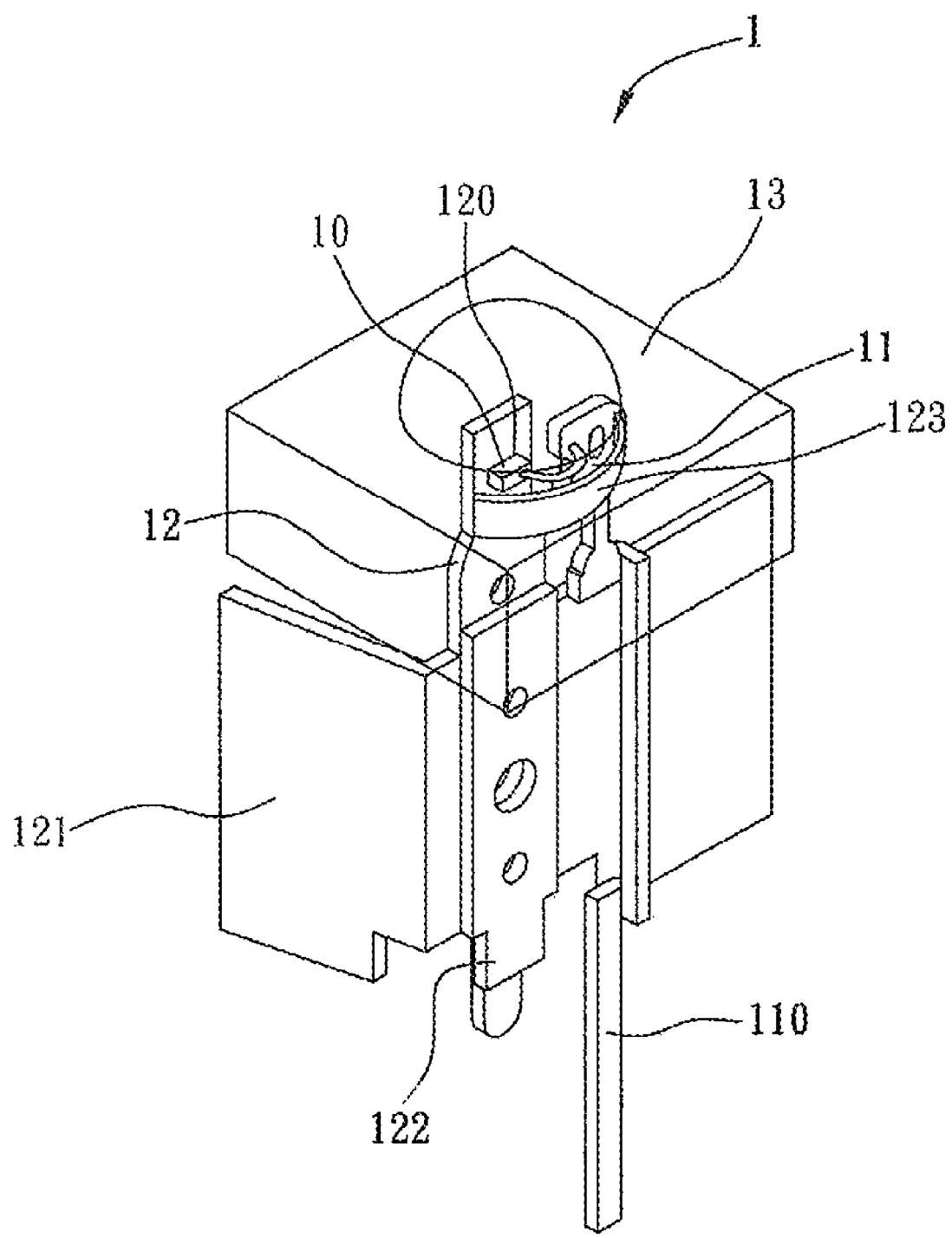
FIG. 8 is a schematic diagram showing another embodiment of the substrate of the light emitting device of the present invention.
Figure 9:
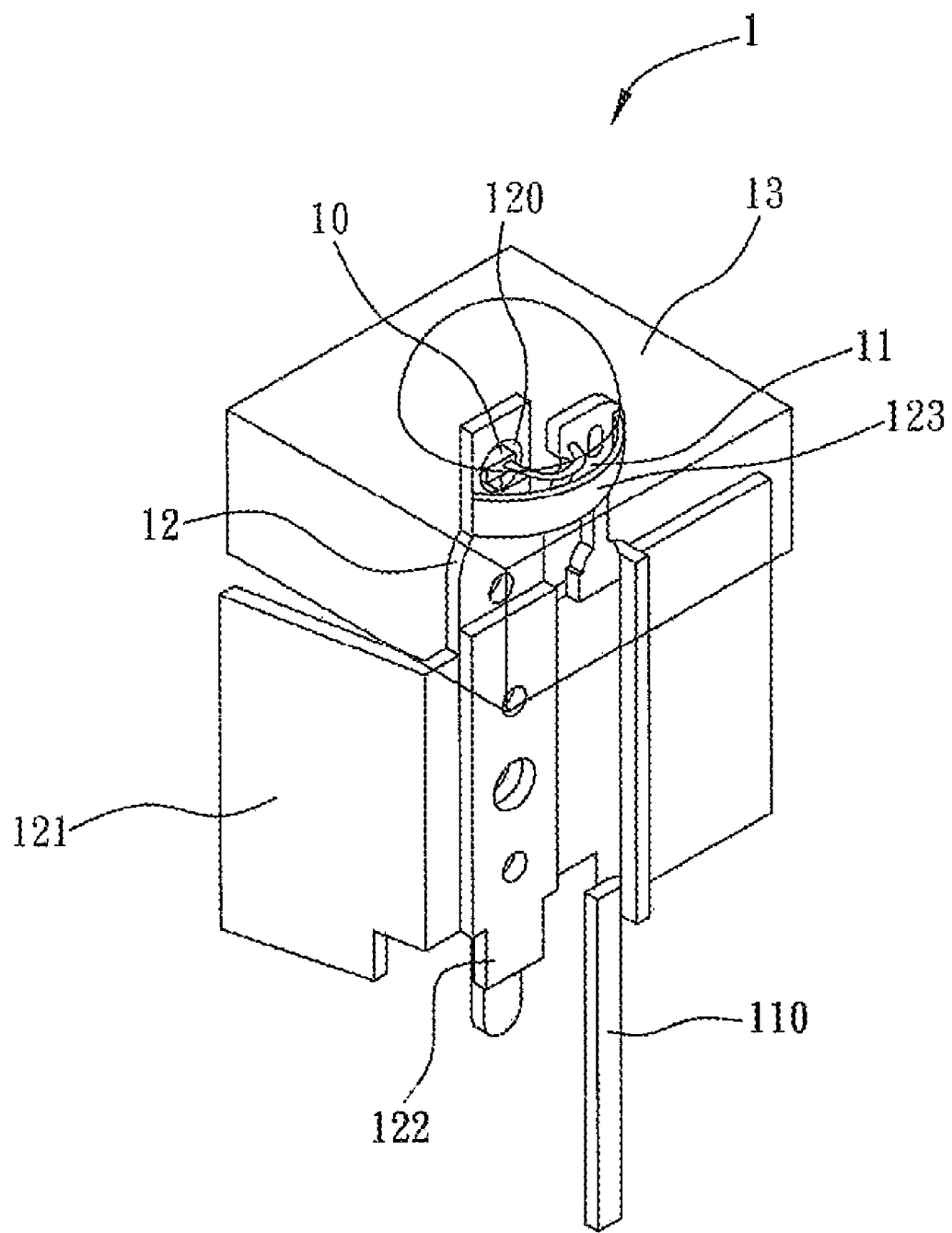
FIG. 9 is a schematic diagram depicting a fourth embodiment of a carrier portion of a substrate of the light emitting device of the present invention.

Referring to FIG. 7, the carrier portion 120 of the substrate 12 can be disposed on the side of the substrate 12 so as to allow the light emitting unit 10 to generate light in a different angle to that shown in the previous embodiments. Referring in conjunction to FIG. 8, an optical path changing portion 123 is further provided at the location corresponding to the carrier portion 120, to change the optical path of the light emitted by the light source generated from the light emitting unit 10. In this embodiment, the optical path changing portion 123 has a half bowl shape, and the concave part of the optical path changing portion 123 corresponds to the light emitting unit 10. Referring in conjunction to FIG. 9 as well, the carrier portion 120 of the substrate 12 can be configured to have a bowl shape for receiving the light emitting unit 10 and to reflect light emitted by the light source generated from the light emitting unit 1, obtaining the purpose of shaping the emitting light.

Figure 10:
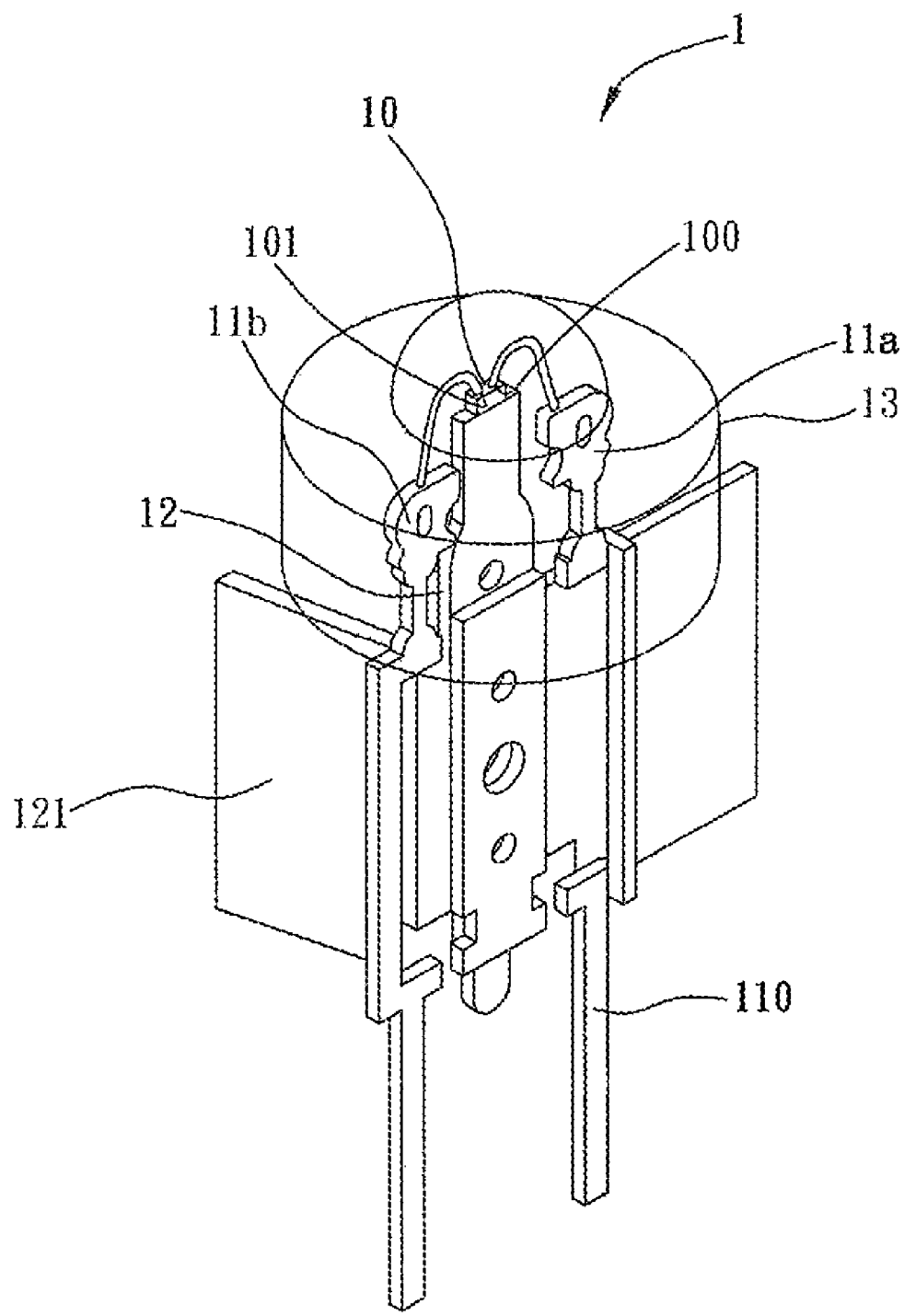
FIG. 10 is a 3-D schematic diagram of a second embodiment of the light emitting device of the present invention.

Referring now to FIG. 10, a 3-D schematic diagram of a second embodiment of the light emitting device 1 of the present invention is shown. As shown, the light emitting device 1 comprises a light emitting unit 10, a first conductive element 11a and a second conductive element 11b electrically coupled with the light emitting unit 10, a substrate 12 assembled to the light emitting unit 10 and a transparent body 13 covering the light emitting unit 10 and a portion of the first conductive element 11a, the second conductive element 11b and the substrate 12.

The difference between the first embodiment and the second embodiment is in that the substrate 12 in the second embodiment only functions as a heat dissipater, that is, the substrate 12 only comprises the carrier 20 for carrying the light emitting unit 10 and the heat dissipating portion 121 extended from the carrier portion 120 for dissipating heat but unlike the substrate 12 in the first embodiment, it is not electrically coupled to the light emitting unit 10. As shown, the light emitting unit 10 is implemented as a light emitting chip with electrodes on both sides. The first conductive element 11a is electrically coupled to the first electrode 100 of the light emitting unit 10 via wire bonding for power connection. The second conductive element 11b is electrically coupled to the second electrode 101 of the light emitting unit 10 for power connection. In other words, the power in the second embodiment is connected to the first and the second conductive elements 11a and 11b, respectively.

Figure 11:
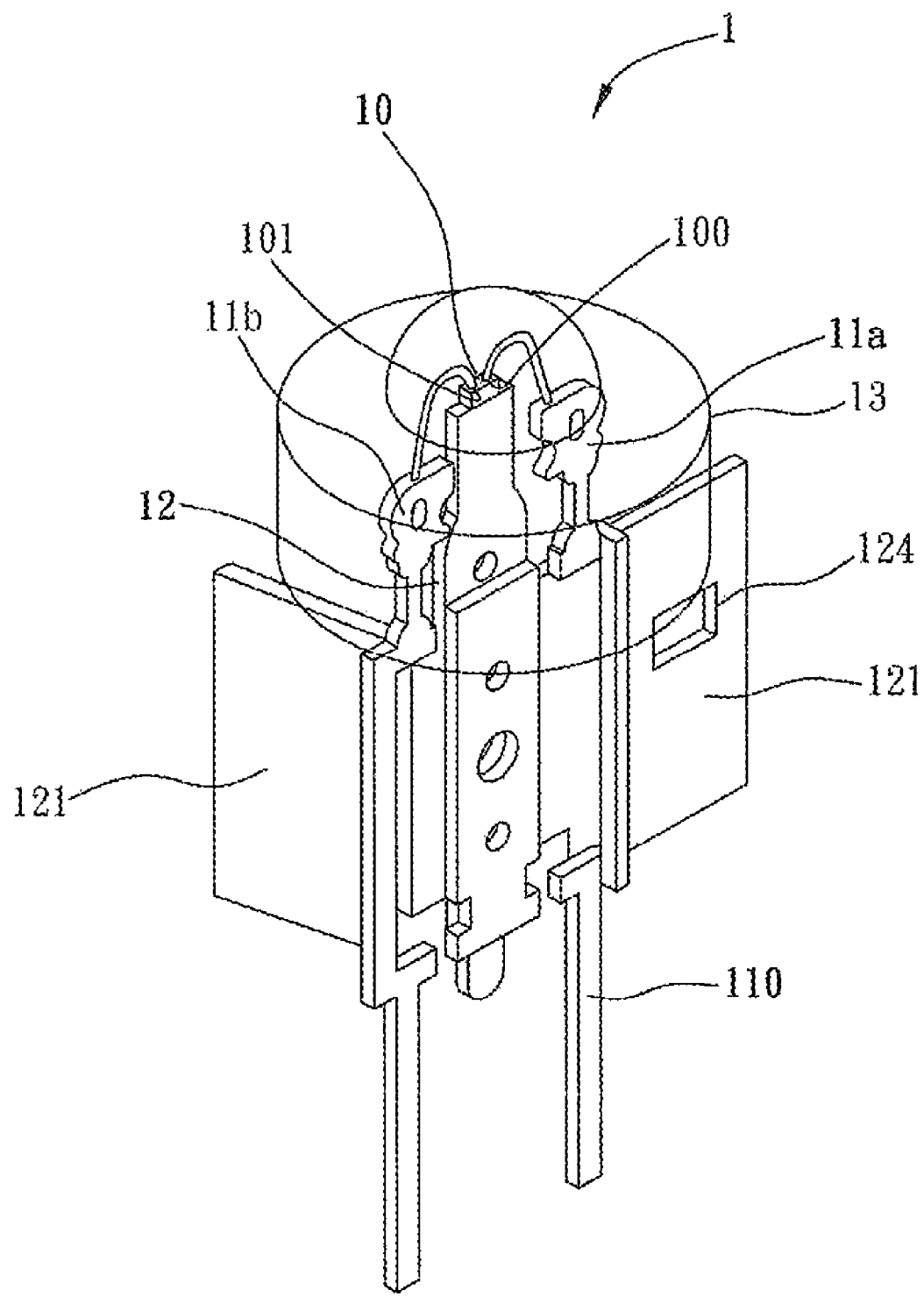
FIG. 11 is a schematic diagram depicting a third embodiment of a heat dissipating portion of a substrate of the light emitting device of the present invention.

Referring to FIG. 11, a through hole 124 is further provided on the heat dissipating portion 121 of the substrate 12 of the light emitting device 1 of the present invention. The through hole 124 not only increases the contact area between the heat dissipating portion 121 and the air, but also allows air flow, thereby providing even better heat dissipating effect for the light emitting device 1.

Figure 12:
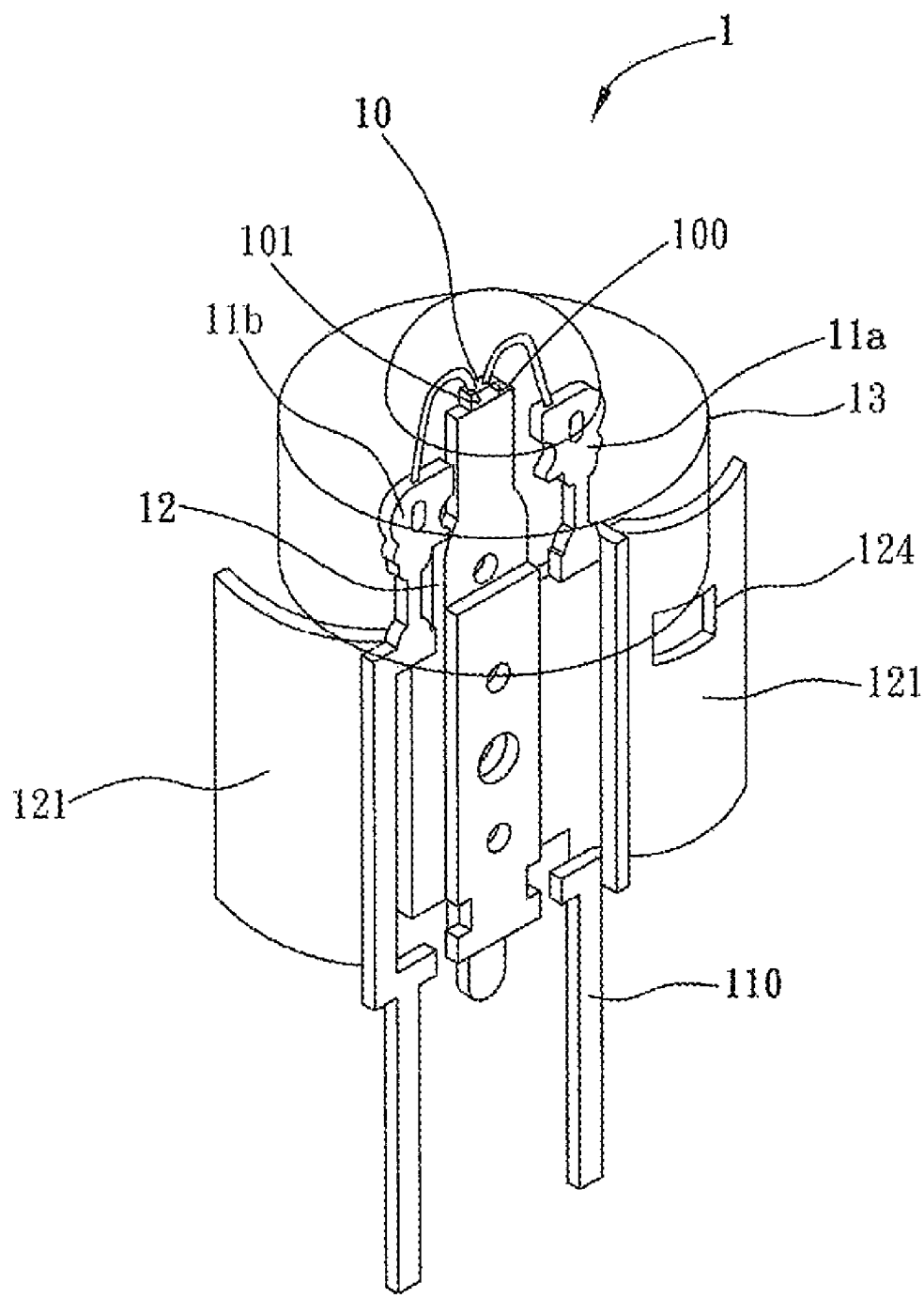
FIG. 12 is a schematic diagram depicting a fourth embodiment of a heat dissipating portion of a substrate of the light emitting device of the present invention.
Figure 13:
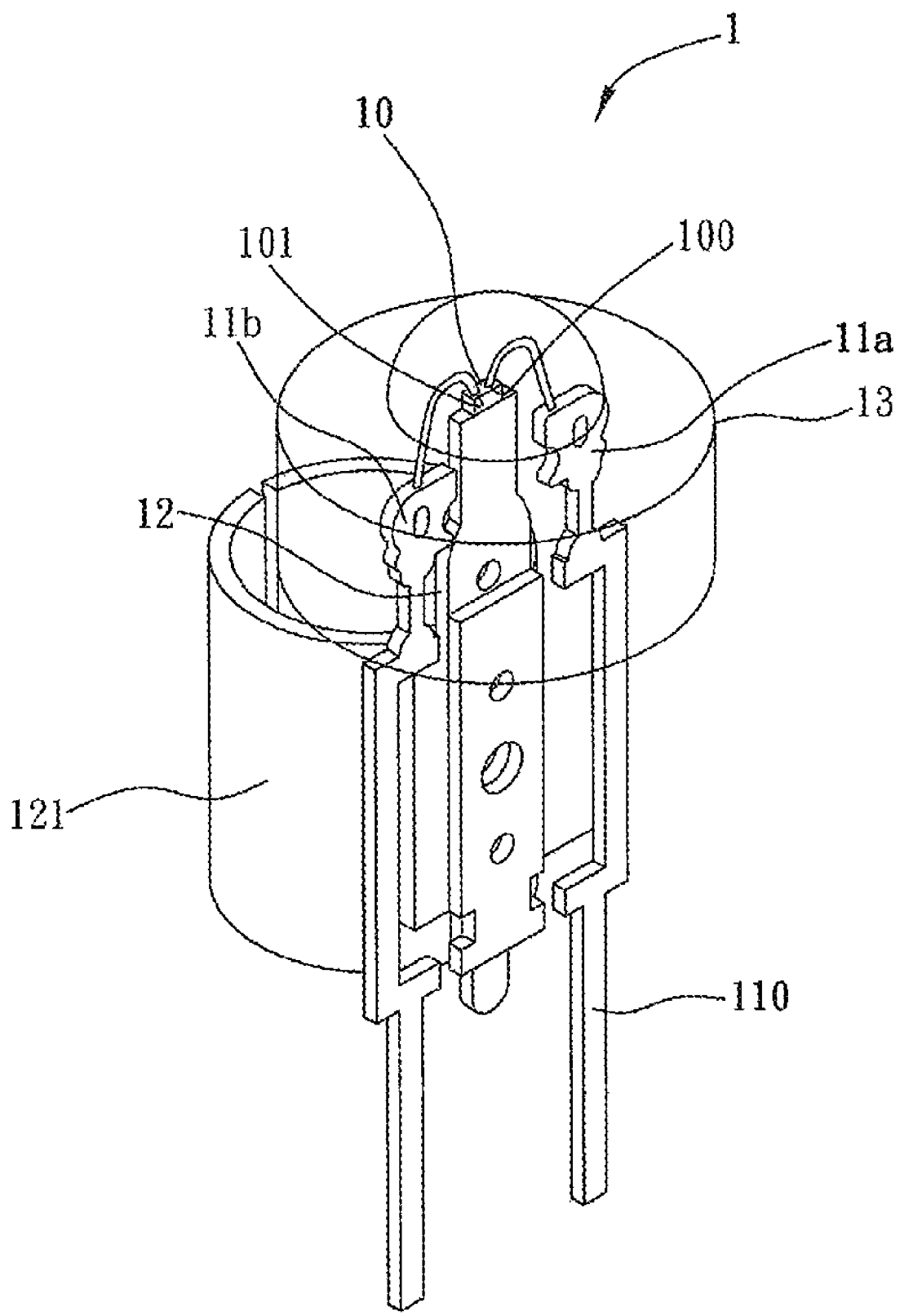
FIG. 13 is a schematic diagram depicting a fifth embodiment of a heat dissipating portion of a substrate of the light emitting device of the present invention.

Referring to FIGS. 12 and 13, the heat dissipating portion 121 of the substrate 12 of the light emitting device 1 of the present invention may have an arc shape and a semi-circular shape to increase the contact area between the heat dissipating portion 121 and the air so as to increase the effect of heat dissipation. Furthermore, the shape of the heat dissipating portion 121 may be continuously bending, square, ellipse and circle depending on actual needs.

Figure 14:
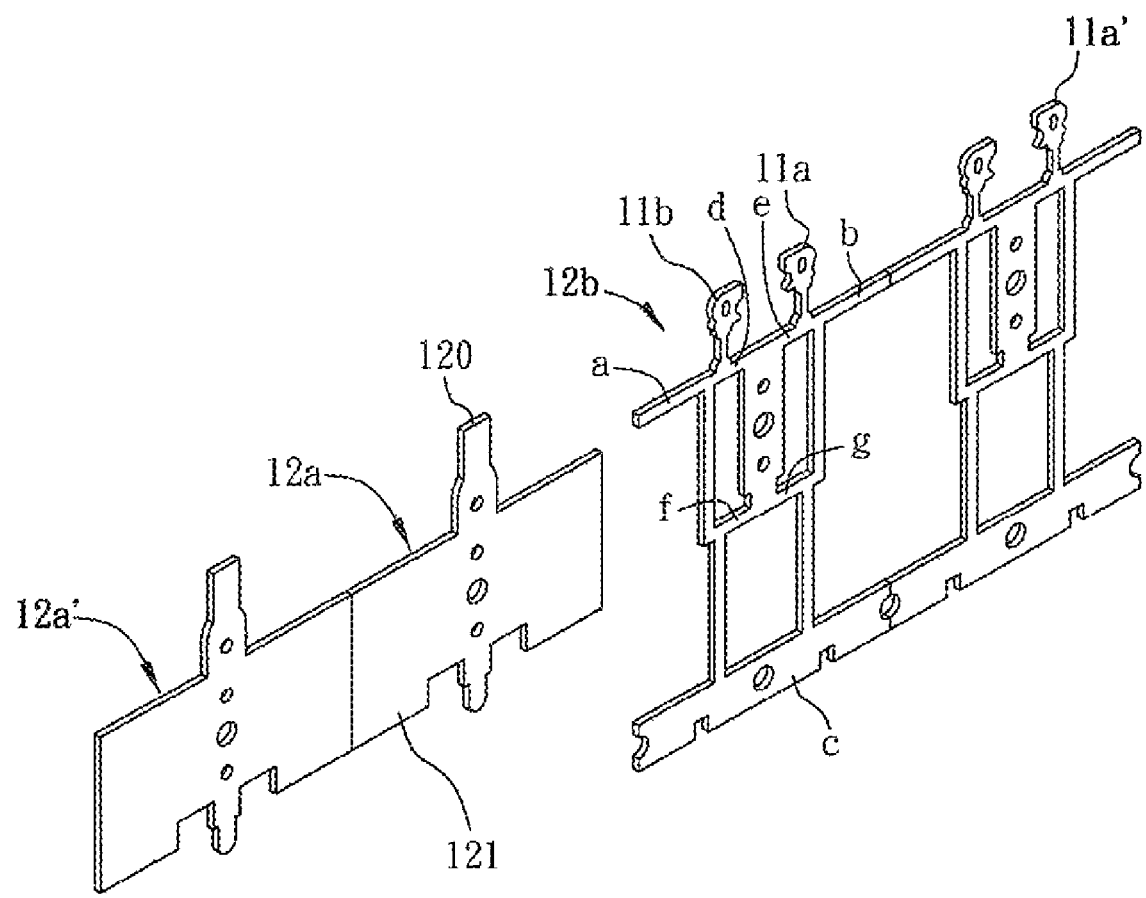
FIGS. 14-20 are schematic diagrams illustrating the steps of the method for producing the light emitting device of the present invention.
Figure 15:
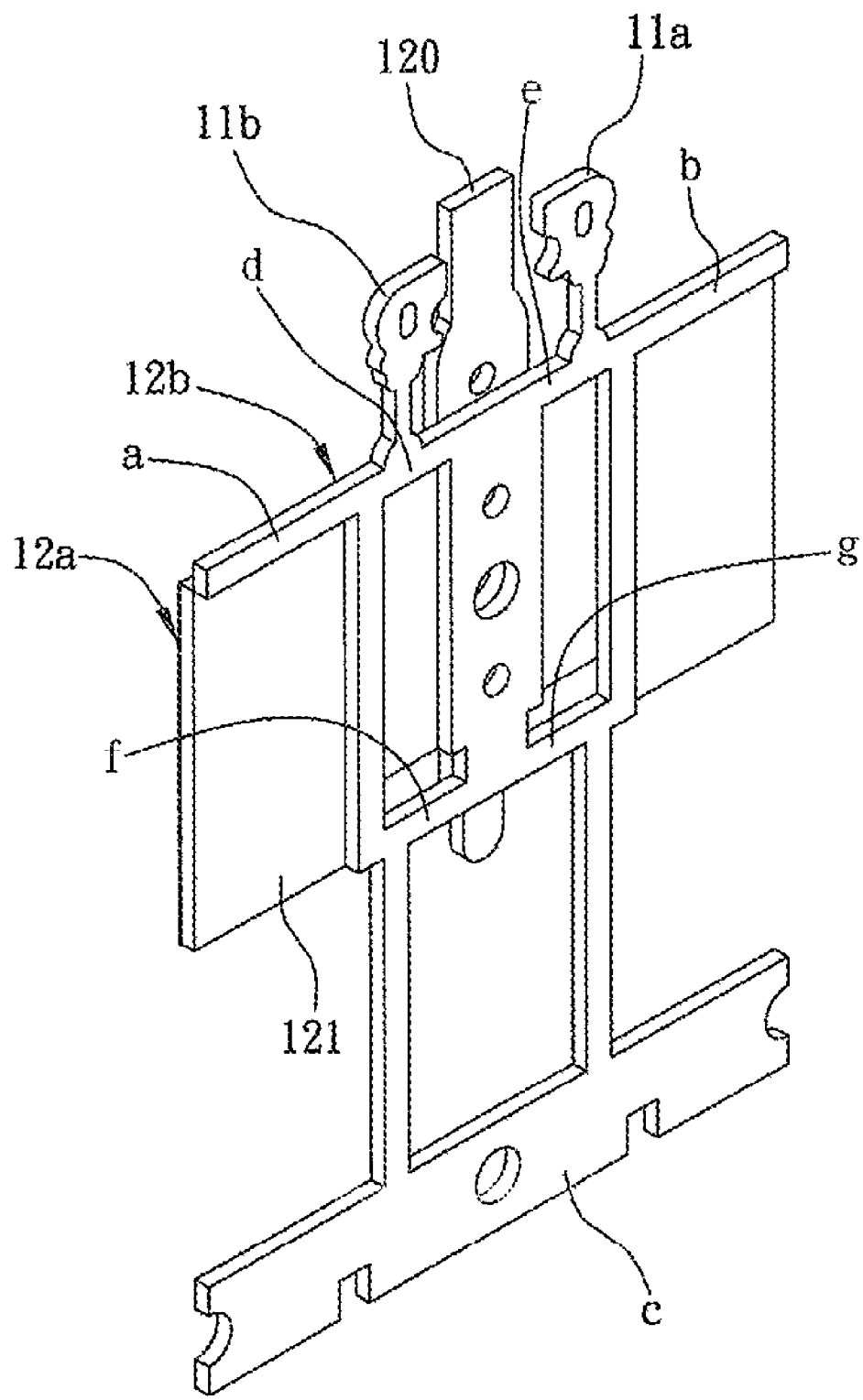
Figure 16:
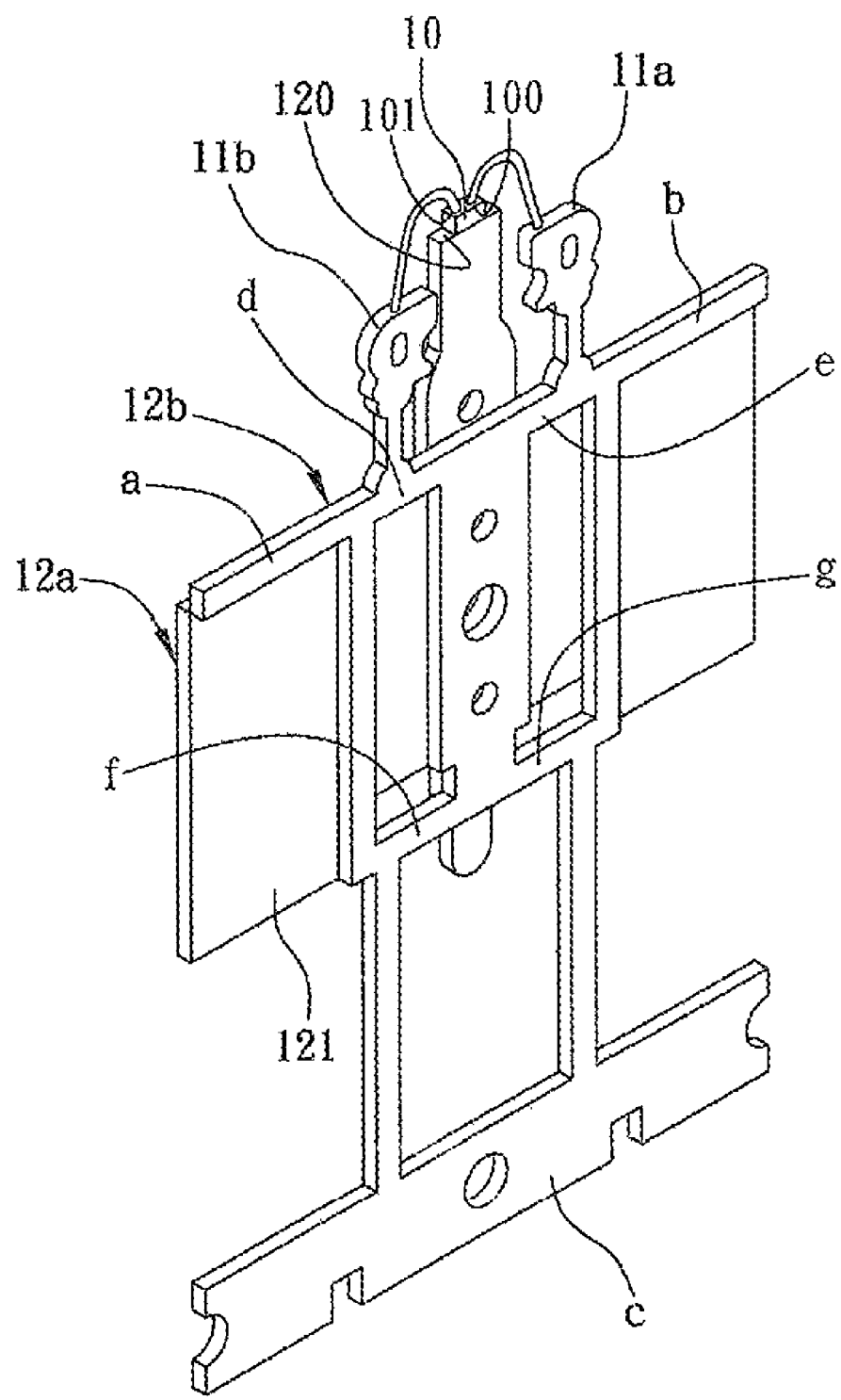
Figure 17:
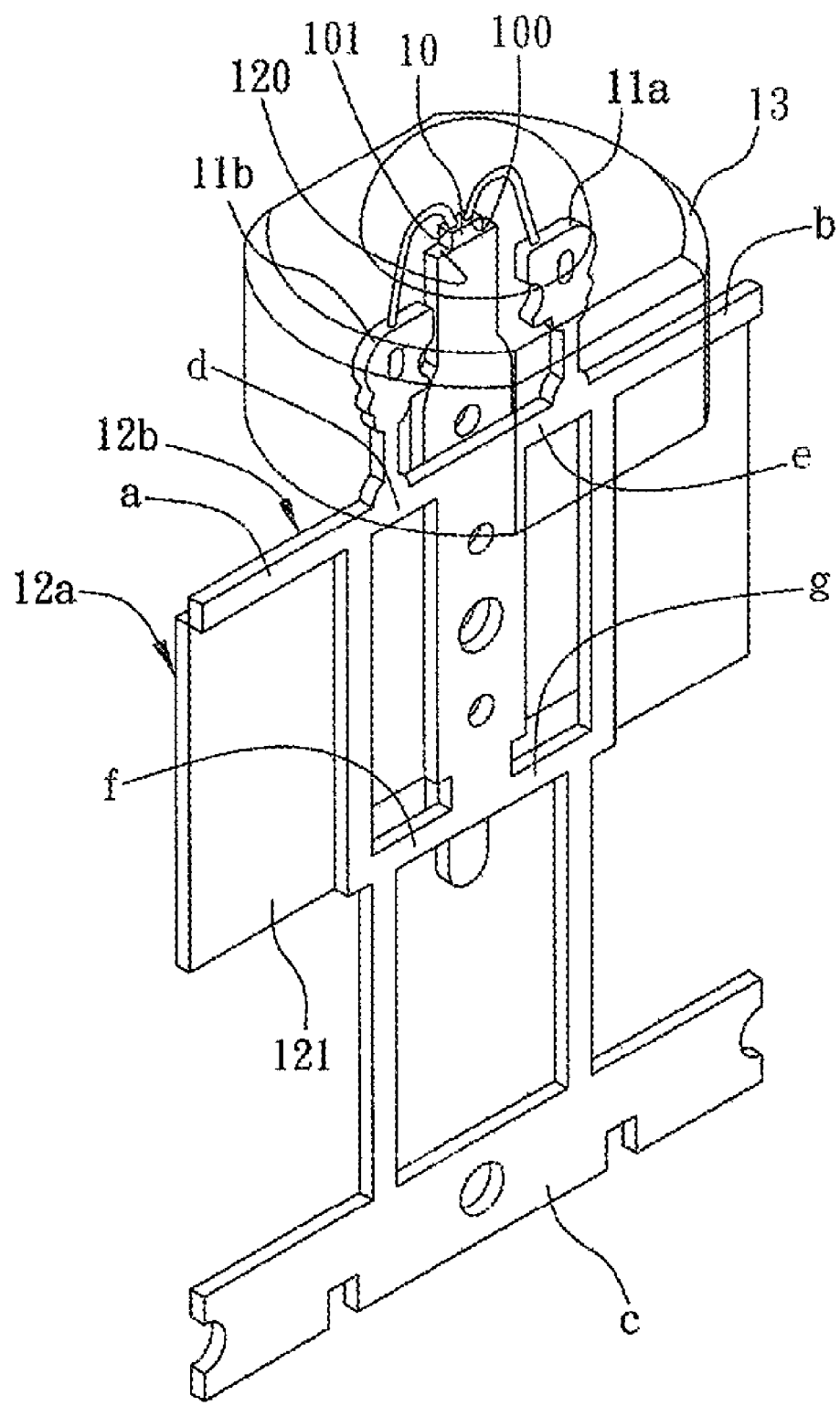
Figure 18:
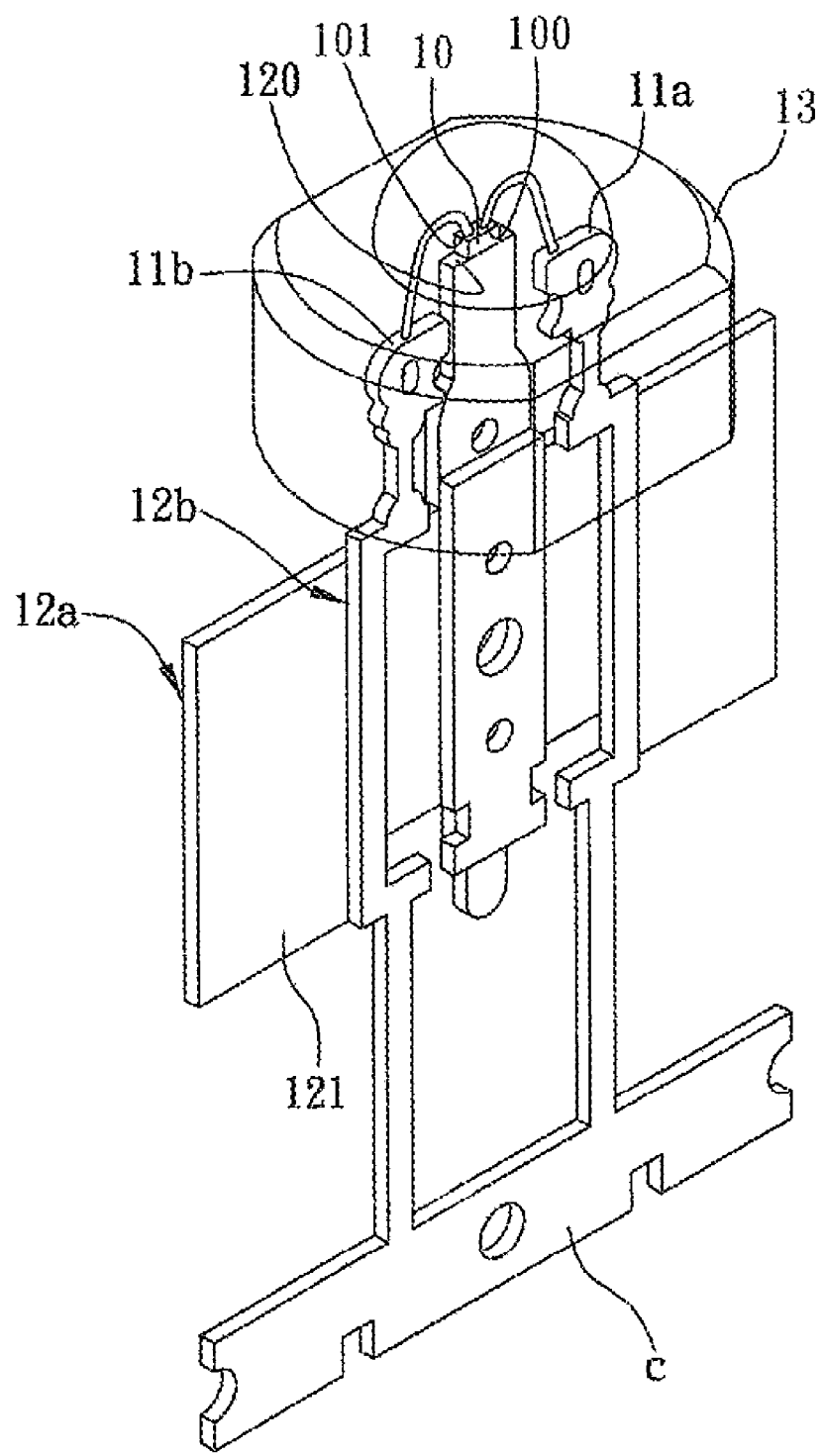
Figure 19:
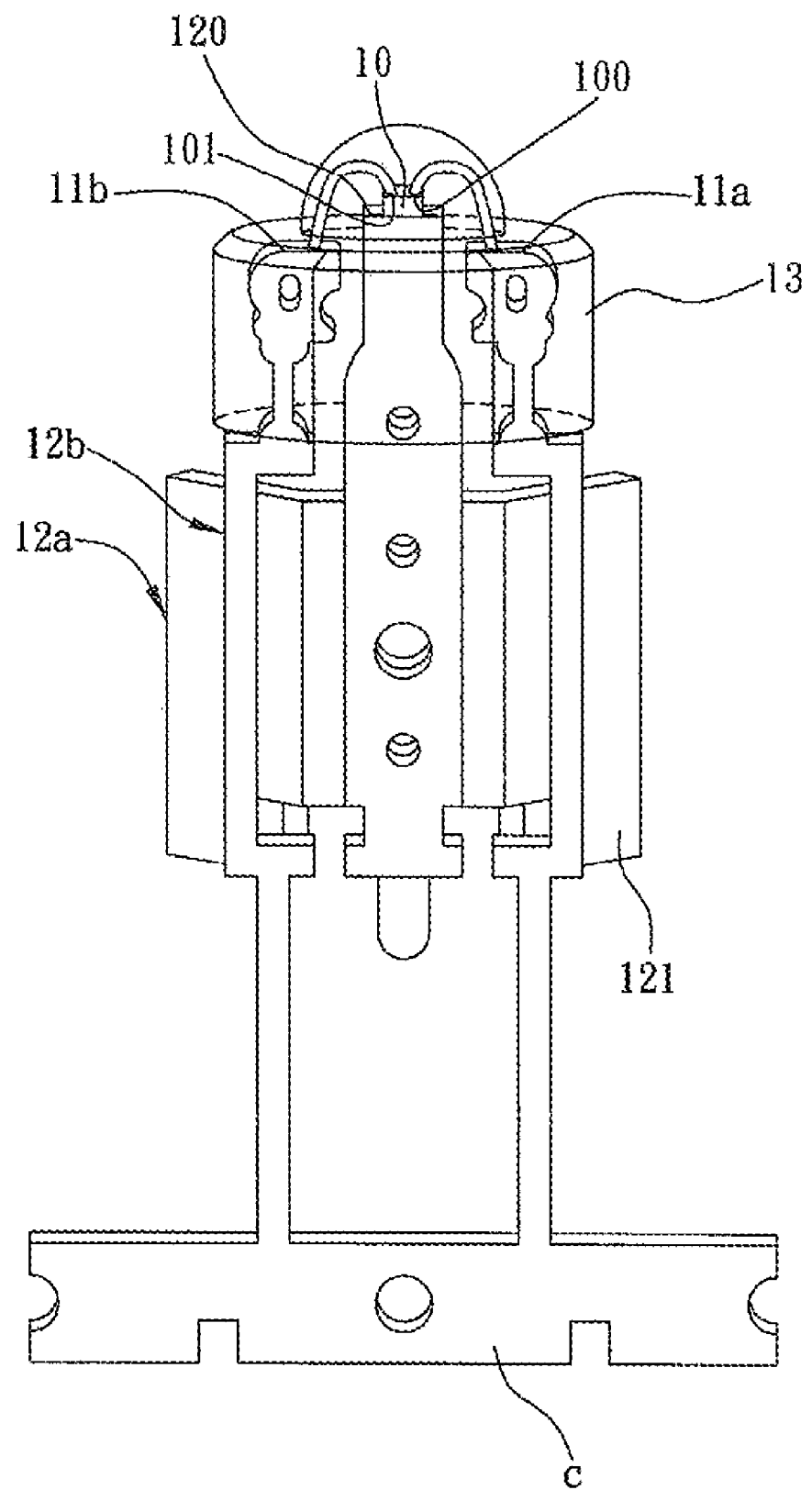
Figure 20:
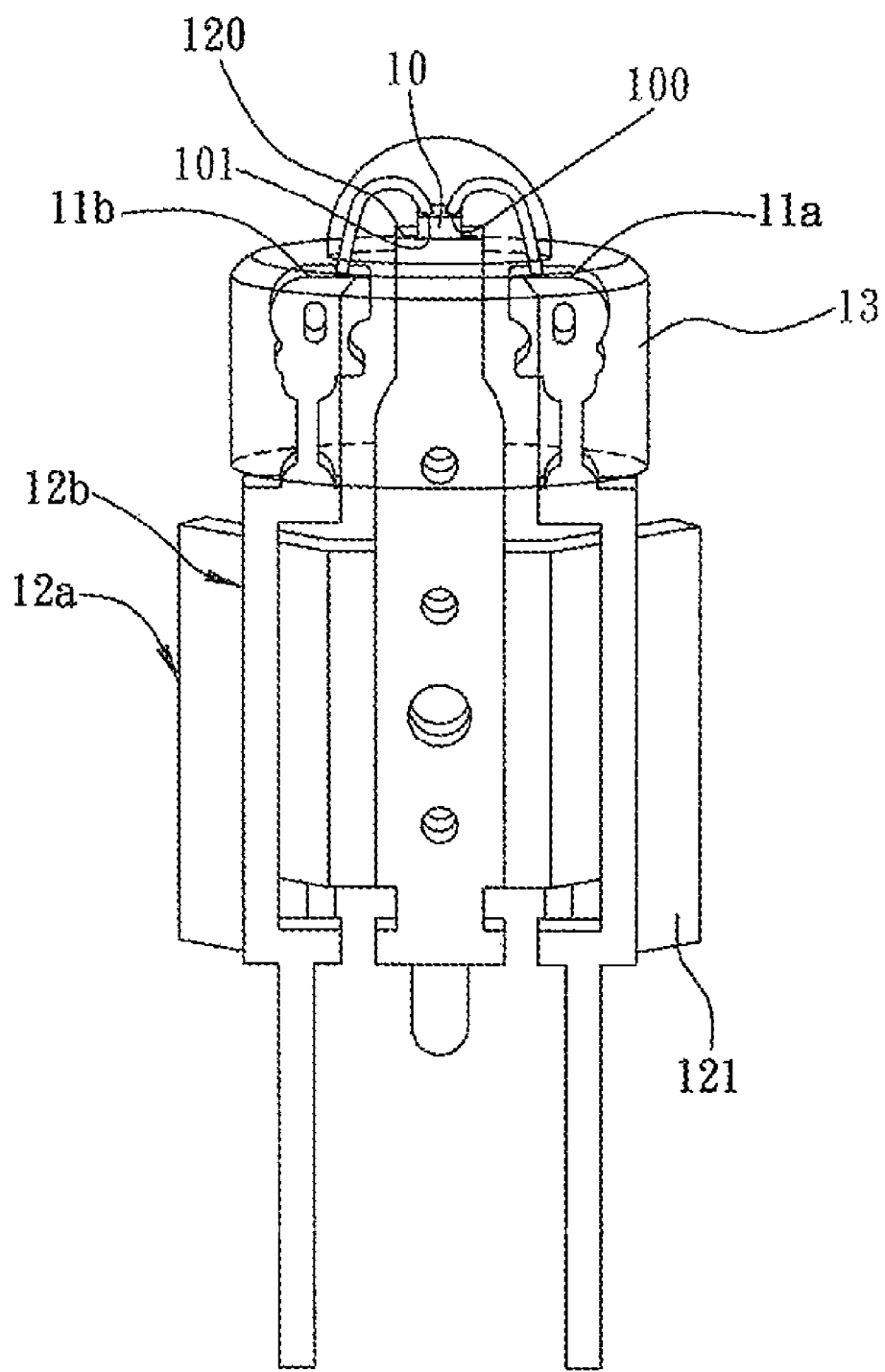
Figure 21:
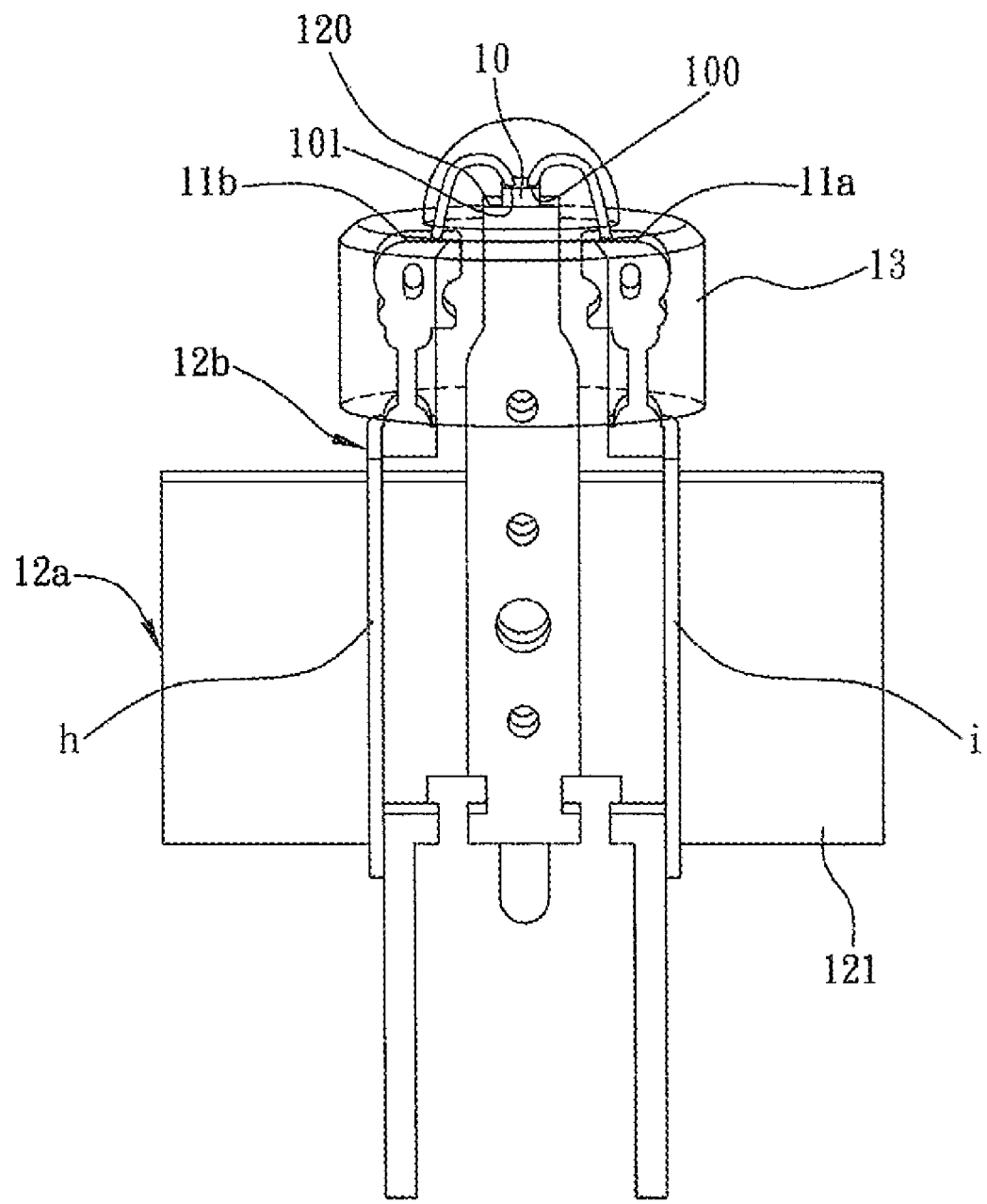
FIG. 21 is a schematic diagram showing the result of another embodiment of the method for producing the light emitting device of the present invention.

Referring to FIGS. 14 to 20, schematic diagrams illustrating the steps in producing the light emitting device of the present invention are shown. As shown in FIG. 14, first substrate units 12a and 12a' for forming the carrier portion 120 for carrying the light emitting unit 10 (see FIG. 2) with the first electrode 100 and the second electrode 101 and the heat dissipating portion 121 extended from the carrier portion 120 are first prepared. Second substrate units 12b and 12b' having temporary connecting pieces a, b, c, d, e, f and g for forming the first conductive element 11a and the second conductive element 11b for power connection are also prepared. Although two first substrate units 12a and 12a' and two second substrate units 12b and 12b' are shown, the present invention is not limited to this but the number of the substrate units can be modified according to actual needs. For brevity, the following description is made in the example of just one first substrate unit and one second substrate unit. Then as shown in FIG. 15, the second substrate unit 12b is correspondingly attached to the first substrate unit 12a. Thereafter, the light emitting unit 10 is then disposed on the first substrate unit 12a and the first conductive element 11a and the second conductive element 11b of the second substrate unit 12b are electrically coupled to the first electrode 100 and the second electrode 101 of the light emitting unit 10, respectively, via wire bonding, as shown in FIG. 16. Then, the light emitting unit 10 and portions of the first substrate unit 12a and the second substrate unit 12b are encapsulated by the transparent body 13 as shown in FIG. 17. Then, some of the temporary connecting pieces a, b, d, e, f and g of the second substrate unit 12b are cut off as shown in FIG. 18. Thereafter, the heating dissipating portion 121 of the first substrate unit 12a is bent as shown in FIG. 19 (or a first metal arm h and a second metal arm of the second substrate unit 12b are bent in FIG. 21). Finally, as shown in FIG. 20, the remaining temporary connecting piece c of the second substrate unit 12b is cut off.

Figure 22:
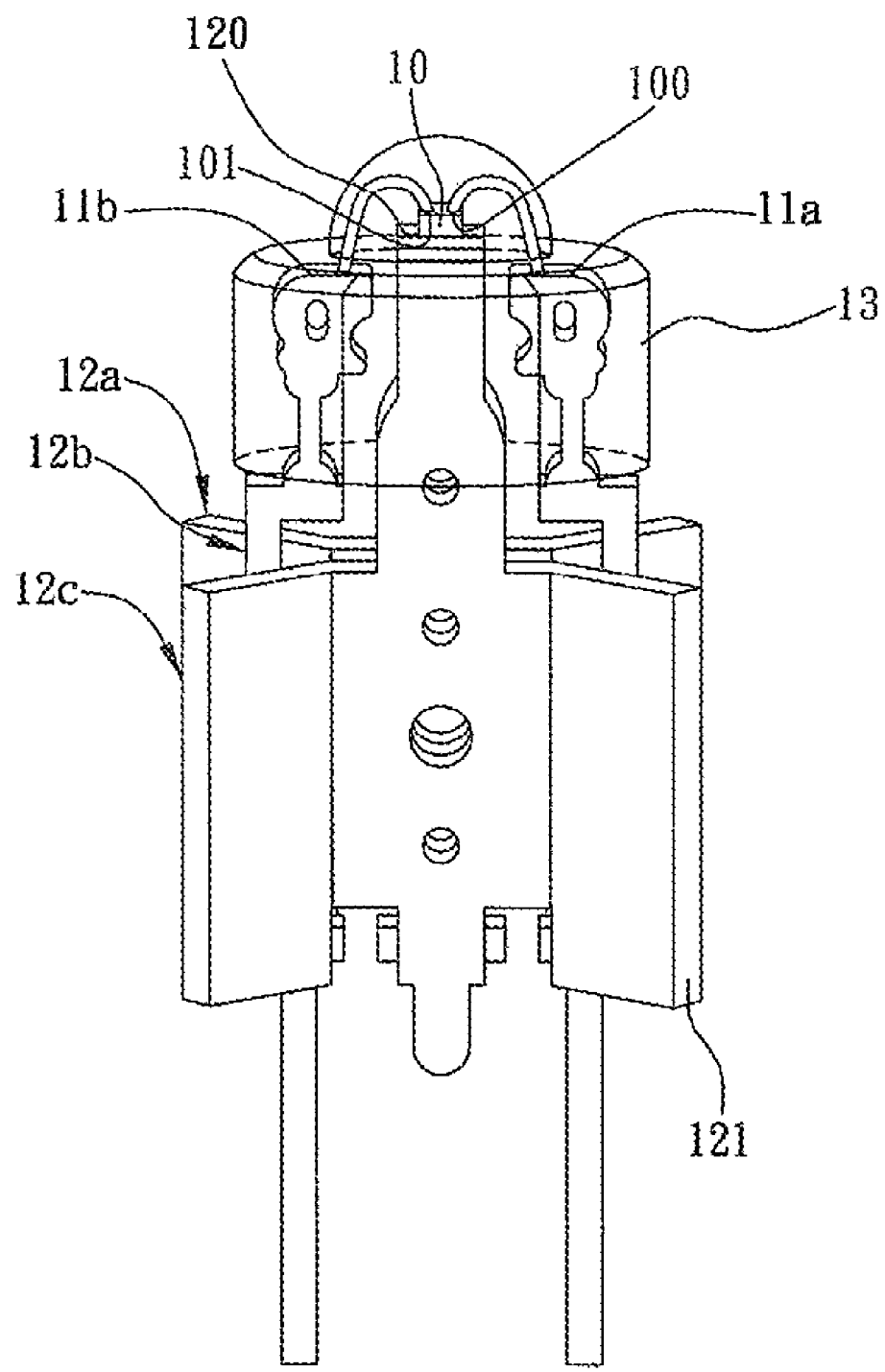
FIGS. 22 and 23 are schematic diagrams illustrating the result of yet another embodiment of the method for producing the light emitting device of the present invention.
Figure 23:
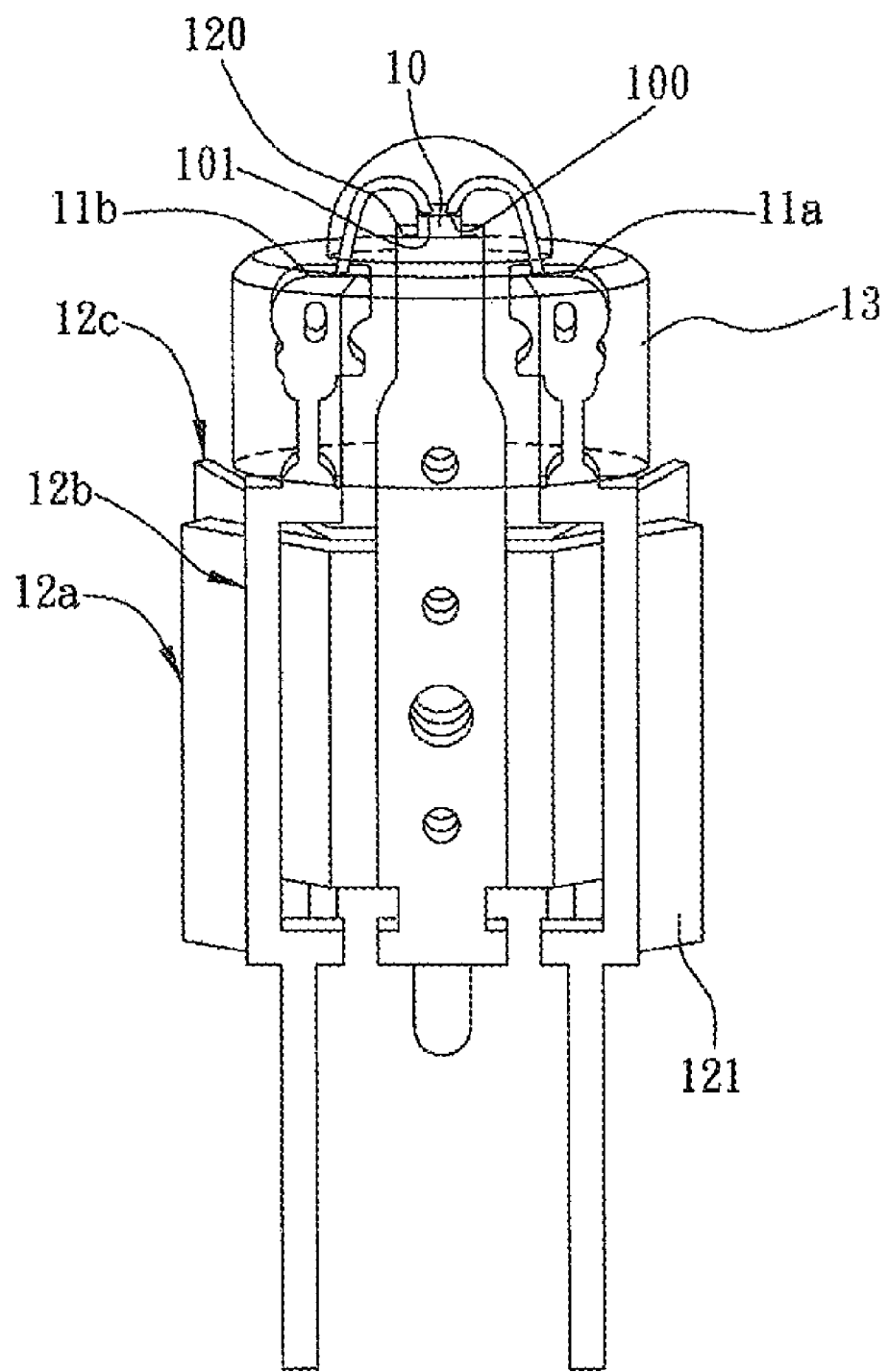

Referring to FIGS. 22 and 23, schematic diagrams illustrating the result of another embodiment of the method for producing the light emitting device of the present invention are shown. As shown, the method for producing the light emitting device further comprises assembling a third substrate 12c same as the first substrate unit 12a in order to further increase the effect of heat dissipation.

Figure 24:
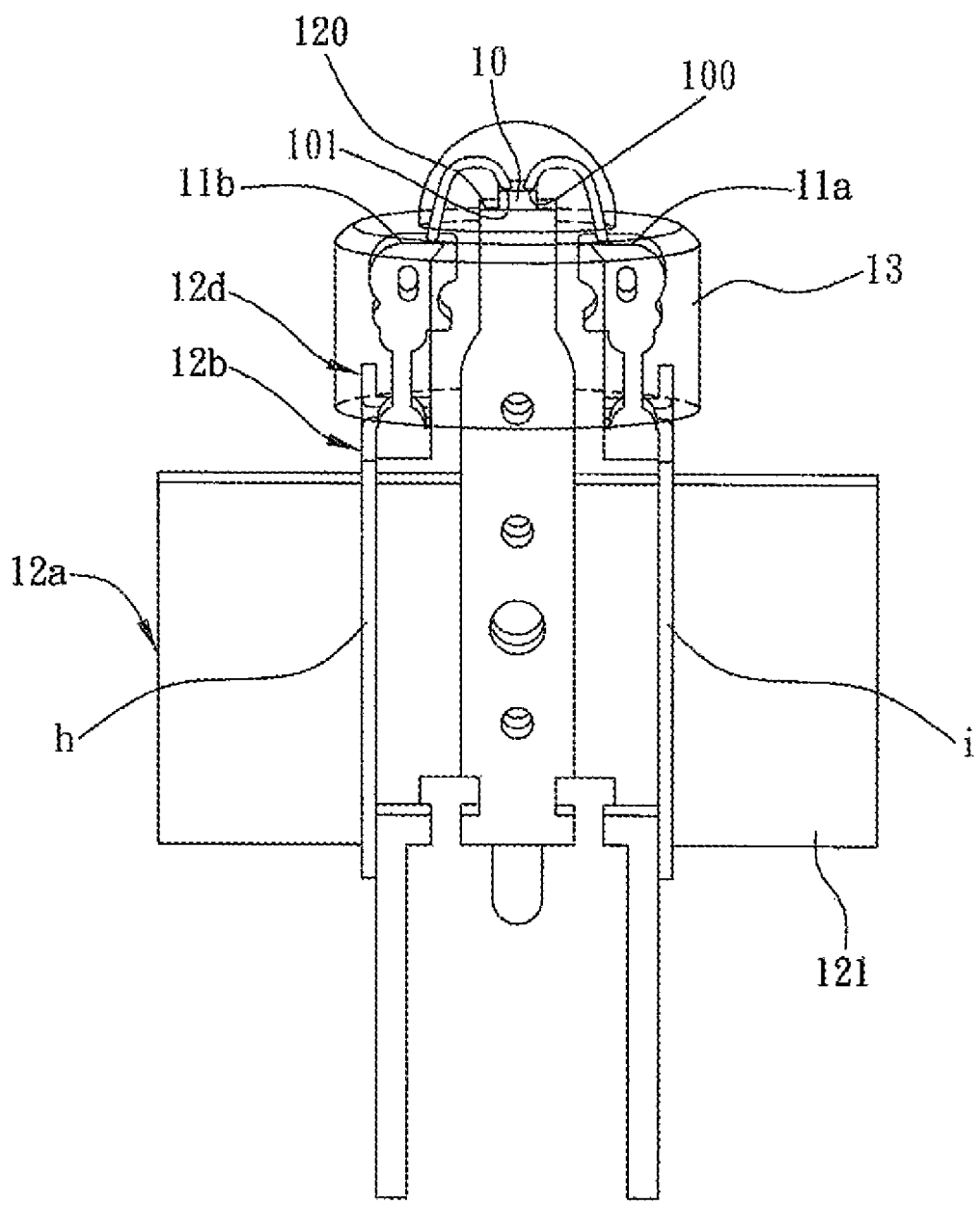
FIG. 24 is a schematic diagram showing the result of still another embodiment of the method for producing the light emitting device of the present invention.

Referring to FIG. 24, a schematic diagram illustrating the result of yet another embodiment of the method for producing the light emitting device of the present invention are shown. As shown, the method for producing the light emitting device further comprises assembling a fourth substrate 12d same as the second substrate unit 12b for provision of additional light emitting unit and conductive pins.

It should be noted that the various elements in the illustration of this method are the same as those in the abovementioned light emitting device, so the descriptions thereof are not repeated.

In summary, the light emitting device of the present invention and the method for producing the same provides good heat dissipation by having a large contact area between the heat dissipating portion of the substrate and the air.

The above embodiments are only used to illustrate the principles of the present invention, and they should not be construed as to limit the present invention in any way. The above embodiments can be modified by those with ordinary skills in the arts without departing from the scope of the present invention as defined in the following appended claims.

What is claimed is:

1. A light emitting device, comprising:
 a substrate comprising a carrier portion and a planar heat dissipating portion extending from the carrier portion for heat dissipation;

a light emitting unit disposed on the carrier portion, the light emitting unit comprising a first electrode and a second electrode for emitting light, the second electrode being electrically coupled to the substrate; and a conductive element disposed on a planar side of the planar heat dissipating portion and electrically coupled to the first electrode of the light emitting unit, wherein the conductive element is disposed on a plane not parallel to a plane of the carrier portion on which the light emitting unit is disposed.

2. The light emitting device of claim 1, wherein the heat dissipating portion of the substrate is bent with respect to an optical axis of the light.

3. The light emitting device of claim 1, further comprising a transparent body for fixing the light emitting unit onto the carrier portion of the substrate, protecting the light emitting unit and allowing the conductive element and the substrate to form relative fixing positions.

4. The light emitting device of claim 3, wherein the transparent body is made of an encapsulating gel.

5. The light emitting device of claim 3, wherein the transparent body comprises a lens for shaping the light.

6. The light emitting device of claim 5, wherein the transparent body is made of an encapsulating gel.

7. The light emitting device of claim 5, wherein the transparent body has a square cross section.

8. The light emitting device of claim 7, wherein the transparent body is made of an encapsulating gel.

9. The light emitting device of claim 1, wherein the carrier portion is a cross section of the substrate.

10. The light emitting device of claim 9, wherein the carrier portion is a front end protrusion of the substrate.

11. The light emitting device of claim 1, wherein the carrier portion is a front end concave of the substrate.

12. The light emitting device of claim 11, wherein the front end concave of the substrate is in the shape of a bowl.

13. The light emitting device of claim 1, wherein the carrier portion is a side of the substrate.

14. The light emitting device of claim 13 further comprising an optical path changing portion disposed on the substrate and corresponding in position to the carrier portion for changing a path of the light.

15. The light emitting device of claim 14, wherein the optical path changing portion is in the shape of a half-bowl, and has a concave portion corresponding to the light emitting unit.

16. The light emitting device of claim 1 further comprising a through hole installed on the heat dissipating portion of the substrate for dissipating heat.

17. The light emitting device of claim 1, wherein the heat dissipating portion is in the shape of one selected from the group consisting of a bending angle, an arc, a continuous bending, a square, an ellipse, a semi-circle and a circle.

18. The light emitting device of claim 1, wherein the substrate is electrically coupled to the light emitting unit by one selected from the group consisting of flip chip and wire bonding techniques.

19. The light emitting device of claim 1, wherein the light emitting unit is a light emitting chip.

20. The light emitting device of claim 1, wherein the conductive element is a metal pin.

21. A light emitting device, comprising:
a substrate comprising a carrier portion and a heat dissipating portion extending from the carrier portion;

a light emitting unit disposed on the carrier portion, the light emitting unit comprising a first electrode and a second electrode for emitting light;

a first conductive element electrically coupled to the first electrode of the light emitting unit; and a second conductive element electrically coupled to the second electrode of the light emitting unit, wherein the first and second conductive elements are disposed on the same side or on different sides of a heat dissipating face of the planar heat dissipating portion.

22. The light emitting device of claim 21, wherein the heat dissipating portion of the substrate is bent with respect to an optical axis of the light.

23. The light emitting device of claim 21 further comprising a transparent body for fixing the light emitting unit onto the carrier portion of the substrate, protecting the light emitting unit and allowing the conductive element and the substrate to form relative fixing positions.

24. The light emitting device of claim 23, wherein the transparent body is made of an encapsulating gel.

25. The light emitting device of claim 23, wherein the transparent body comprises a lens for shaping the light.

26. The light emitting device of claim 25, wherein the transparent body is made of an encapsulating gel.

27. The light emitting device of claim 25, wherein the transparent body has a square cross section.

28. The light emitting device of claim 27, wherein the transparent body is made of an encapsulating gel.

29. The light emitting device of claim 21, wherein the carrier portion is a cross section of the substrate.

30. The light emitting device of claim 29, wherein the carrier portion is a front end protrusion of the substrate.

31. The light emitting device of claim 21, wherein the carrier portion is a front end concave of the substrate.

32. The light emitting device of claim 31, wherein the front end concave of the substrate is in the shape of a bowl.

33. The light emitting device of claim 21, wherein the carrier portion is a side of the substrate.

34. The light emitting device of claim 33 further comprising an optical path changing portion disposed on the substrate and corresponding in position to the carrier portion for changing a path of the light.

35. The light emitting device of claim 34, wherein the optical path changing portion is in the shape of a half bowl, and has a concave portion corresponding to the light emitting unit.

36. The light emitting device of claim 21 further comprising a through hole installed on the heat dissipating portion of the substrate for dissipating heat.

37. The light emitting device of claim 21, wherein the heat dissipating portion is in the shape of one selected from the group consisting of a bending angle, an arc, a continuous bending, a square, an ellipse, a semi-circle and a circle.

38. The light emitting device of claim 21, wherein the first and second conductive elements are electrically coupled to the light emitting unit by one selected from the group consisting of flip chip and wire bonding techniques.

39. The light emitting device of claim 21, wherein the light emitting unit is a light emitting chip.

40. The light emitting device of claim 21, wherein at least one of the first and second conductive elements is a metal pin.

* * * * *